(12) United States Patent
Shin et al.

(10) Patent No.: US 12,501,754 B2
(45) Date of Patent: Dec. 16, 2025

(54) DISPLAY APPARATUS INCLUDING DISPLAY MODULE AND MANUFACTURING METHOD THEREOF

(71) Applicant: SAMSUNG ELECTRONICS CO., LTD., Suwon-si (KR)

(72) Inventors: Seonghwan Shin, Suwon-si (KR); Gunwoo Kim, Suwon-si (KR); Hyunsun Kim, Suwon-si (KR); Yangsoo Son, Suwon-si (KR); Tackmo Lee, Suwon-si (KR); Jeongin Han, Suwon-si (KR); Soonmin Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 465 days.

(21) Appl. No.: 18/074,075

(22) Filed: Dec. 2, 2022

(65) Prior Publication Data

US 2023/0090105 A1    Mar. 23, 2023

Related U.S. Application Data

(63) Continuation of application No. PCT/KR2022/018039, filed on Nov. 16, 2022.

(30) Foreign Application Priority Data

Dec. 17, 2021  (KR) .......................... 10-2021-0181590

(51) Int. Cl.
*H10H 20/855* (2025.01)
*H01L 23/00* (2006.01)
(Continued)

(52) U.S. Cl.
CPC ......... *H10H 20/855* (2025.01); *H01L 25/167* (2013.01); *H01L 24/32* (2013.01);
(Continued)

(58) Field of Classification Search
CPC ..... H01H 20/855; H01L 25/167; H01L 24/32; H01L 24/83; H01L 2224/32145; H01L 2224/83851; H10H 20/0363
See application file for complete search history.

(56) References Cited

U.S. PATENT DOCUMENTS 10,468,396 B2  11/2019  Kim et al.
10,504,878 B2  12/2019  Min et al.
(Continued)

FOREIGN PATENT DOCUMENTS

EP     3 343 273 A2    7/2018
EP     3 835 856 A1    6/2021
(Continued)

OTHER PUBLICATIONS

Communication issued Oct. 21, 2024 by the European Patent Office in European Patent Application No. 22907724.3.
(Continued)

*Primary Examiner* — Mary Ellen Bowman
(74) *Attorney, Agent, or Firm* — Sughrue Mion, PLLC

(57) ABSTRACT

A display module is provided. The display module includes a substrate including a mounting surface, on which a plurality of inorganic light emitting devices is mounted, and a side surface; a front cover covering the mounting surface and including a side end that is in a region outwards from the mounting surface; a side cover covering the side surface of the substrate and bonded to a lower surface of the front cover, corresponding to the region outwards from the mounting surface, and the side surface of the substrate; and a light absorbing end member covering the side end of the front cover and configured to prevent light, emitted from the plurality of inorganic light emitting devices, from passing through the side end of the front cover.

20 Claims, 18 Drawing Sheets

(51) Int. Cl.
   *H01L 25/16* (2023.01)
   *H10H 20/01* (2025.01)
(52) U.S. Cl.
   CPC .... *H01L 24/83* (2013.01); *H01L 2224/32145* (2013.01); *H01L 2224/83851* (2013.01); *H10H 20/0363* (2025.01)

(56) References Cited

U.S. PATENT DOCUMENTS

| | | | |
|---|---|---|---|
| 11,263,933 B2 | 3/2022 | Han et al. | |
| 2015/0054008 A1* | 2/2015 | Rhee | H01L 25/0753 257/89 |
| 2017/0263672 A1* | 9/2017 | Seo | H01L 25/0753 |
| 2018/0190631 A1* | 7/2018 | Kim | G02F 1/13336 |
| 2019/0122592 A1* | 4/2019 | Han | H01L 25/0753 |
| 2020/0119237 A1* | 4/2020 | Kim | G02F 1/133512 |
| 2020/0219862 A1* | 7/2020 | Han | H01L 25/162 |
| 2020/0285271 A1* | 9/2020 | Huang | G02F 1/13336 |
| 2021/0132766 A1* | 5/2021 | Lee | H10K 59/18 |
| 2021/0202449 A1* | 7/2021 | Shin | H10H 20/8506 |
| 2023/0126724 A1* | 4/2023 | Hong | H01L 25/075 257/91 |
| 2023/0180512 A1* | 6/2023 | Yoon | H10K 59/8722 257/40 |
| 2024/0203910 A1* | 6/2024 | Lee | H10H 20/852 |
| 2024/0313173 A1* | 9/2024 | Meng | H10H 20/853 |
| 2024/0313189 A1* | 9/2024 | Kim | H01L 25/167 |

FOREIGN PATENT DOCUMENTS

| | | |
|---|---|---|
| KR | 10-2017-0026026 A | 3/2017 |
| KR | 10-2018-0079079 A | 7/2018 |
| KR | 10-2019-0041413 A | 4/2019 |
| KR | 10-2019-0046684 A | 5/2019 |
| KR | 10-2020-0050278 A | 5/2020 |
| KR | 10-2020-0114646 A | 10/2020 |
| KR | 10-2020-0134788 A | 12/2020 |
| KR | 10-2021-0083875 A | 7/2021 |
| WO | 2022/139393 A1 | 6/2022 |
| WO | 2023/234541 A1 | 12/2023 |

OTHER PUBLICATIONS

International Search Report dated Mar. 16, 2023, issued by the International Searching Authority in International Application No. PCT/KR2022/018039 (PCT/ISA/210).

Written Opinion dated Mar. 16, 2023, issued by the International Searching Authority in International Application No. PCT/KR2022/018039 (PCT/ISA/237).

* cited by examiner

DISPLAY APPARATUS INCLUDING DISPLAY MODULE AND MANUFACTURING METHOD THEREOF

CROSS-REFERENCE TO THE RELATED APPLICATIONS

This application is a bypass continuation application of International Application No. PCT/KR2022/018039, filed on Nov. 16, 2022, which claims priority to Korean Patent Application No. 10-2021-0181590, filed on Dec. 17, 2021, in the Korean Intellectual Property Office, the disclosures of which are incorporated by reference herein in their entireties.

BACKGROUND

1. Field

The disclosure relates to a display apparatus capable of displaying an image by combining modules in which an inorganic light emitting device that is self-luminous is mounted on a substrate.

2. Description of Related Art

A display apparatus is a type of an output device that visually displays data information such as characters, figures, and images.

In general, a display apparatus has mainly used a liquid crystal panel that requires a backlight or an organic light-emitting diode (OLED) panel provided with a film of an organic compound that emits light by itself in response to an electric current. However, the liquid crystal panel has difficulties such as a slow-response time, and high-power consumption, and further it is difficult to make the liquid crystal panel compact because the liquid crystal panel does not emit light by itself, and requires a backlight. In addition, because the OLED panel emits light by itself, the OLED panel does not require a backlight, and thus it is possible to make the OLED panel thin. However, the OLED panel is susceptible to screen burn-in. Screen burn-in is a phenomenon in which, if the same screen is displayed for a long time, the lifetime of the sub-pixels expires and the previous screen remains the same even when the screen is changed. Accordingly, a micro light emitting diode (micro-LED or µLED) panel that includes an inorganic light emitting device on a substrate and uses the inorganic light emitting device itself as a pixel has been studied as a new panel to replace the OLED.

A micro-light emitting diode display panel (hereinafter, micro-LED panel) is a type of a flat display panel that is composed of a plurality of inorganic light emitting diodes (inorganic LEDs) that is 100 micrometers or less.

The micro-LED panel is also a self-light emitting device, but the micro-LED does not suffer from screen burn-in and has excellent luminance, resolution, power consumption, and durability because of its inorganic nature.

In comparison with the LCD panel requiring a backlight, a micro-LED panel may offer better contrast, response times, and energy efficiency. Both organic light emitting diodes (OLEDs) and micro-LEDs corresponding to inorganic light emitting devices have good energy efficiency. However, the micro-LED has higher brightness and emission efficiency, and longer lifetime than the OLED.

In addition, by arraying the LEDs on a circuit board in pixel units, it is possible to manufacture a display module in a substrate unit, and it is easy to manufacture a display apparatus in various resolutions and screen sizes according to a customer's order.

SUMMARY

Provided are a display apparatus and a manufacturing method thereof, and more particularly, a display module capable of being suitable for enlargement and a display apparatus including display modules and capable of preventing recognition of a seam caused by light leakage occurring between the display modules.

[Additional aspects will be set forth in part in the description which follows and, in part, will be apparent from the description, or may be learned by practice of the presented embodiments.

According to an aspect of the disclosure, a display module includes: a substrate including a mounting surface, on which a plurality of inorganic light emitting devices is mounted, and a side surface, wherein the mounting surface faces in a first direction and extends in a second direction; a front cover covering the mounting surface and including a side end that is in a region outwards from the mounting surface in the second direction; a side cover covering the side surface of the substrate and bonded to a lower surface of the front cover, corresponding to the region outwards from the mounting surface, and the side surface of the substrate; and a light absorbing end member covering the side end of the front cover and configured to prevent light, emitted from the plurality of inorganic light emitting devices, from passing through the side end of the front cover.

The light absorbing end member may extend from an upper end of the side end of the front cover in a direction opposite to the first direction.

The light absorbing end member may extend from the upper end of the side end of the front cover in the direction opposite to the first direction such as to cover at least a portion of the side cover.

The display module may further include: a metal plate on a rear surface of the substrate, the rear surface being a side of the substrate opposite to the mounting surface; and a ground member covering at least a portion of a side end of the side cover and in contact with the metal plate so as to be grounded with the metal plate.

The light absorbing end member may extend from an upper end of the side end of the front cover in a direction opposite to the first direction such as to cover at least a portion of the side end of the side cover, and wherein the ground member is between the side end of the side cover and the light absorbing end member.

The light absorbing end member may include a light-absorbing material.

The side cover includes a light-absorbing material.

The light absorbing end member may a black color.

The side cover may have the black color.

The ground member may include a metal material.

The ground member may have a higher conductivity than a conductivity of the side cover.

The side end of the front cover and a side end of the side cover may have arranged on a same line that extends in the first direction.

According to an aspect of the disclosure, a display apparatus includes: a display module array including a plurality of display modules horizontally arranged in an M*N matrix, wherein each of the plurality of display modules includes: a substrate including a mounting surface, on which a plurality of inorganic light emitting devices is mounted, and a side surface, wherein the mounting surface faces in a first direction and extends in a second direction; a front cover covering the mounting surface and including a side end that is in a region outwards from the mounting surface in the second direction; a side cover covering the side surface of the substrate and bonded to a lower surface of the front cover, corresponding to the region outside the mounting surface, and the side surface of the substrate; and a light absorbing end member covering the side end of the front cover and configured to prevent light, emitted from the plurality of inorganic light emitting devices, from passing through the side end of the front cover.

The light absorbing end member may extend from an upper end of the side end of the front cover in a direction opposite to the first direction.

The light absorbing end member may extend from the upper end of the side end of the front cover in the direction opposite to the first direction such as to cover at least a portion of the side cover.

According to an aspect of the disclosure, a method of manufacturing a display apparatus, may include: covering a mounting surface, on which a plurality of inorganic light emitting devices is mounted, of a substrate with a front cover, wherein the mounting surface faces in a first direction and extends in a second direction, and the front cover includes a side end that is in a region outwards from the mounting surface in the second direction; providing a side cover such that the side cover covers a side surface of the substrate, and is bonded to a lower surface of the front cover, corresponding to the region outwards from the mounting surface in the second direction, and the side surface of the substrate; and covering the side end of the front cover with a light absorbing end member such that the light absorbing end member is configured to prevent light, emitted from the plurality of inorganic light emitting devices, from passing through the side end of the front cover.

The light absorbing end member may extend from an upper end of the side end of the front cover in a direction opposite to the first direction.

The light absorbing end member may extend from the upper end of the side end of the front cover in the direction opposite to the first direction to cover at least a portion of the side cover.

The method may further include: providing a metal plate on a rear surface of the substrate, the rear surface being a side of the substrate opposite to the mounting surface; and providing a ground member such that the ground member covers at least a portion of a side end of the side cover and is in contact with the metal plate so as to be grounded with the metal plate.

The light absorbing end member may extend from an upper end of the side end of the front cover in a direction opposite to the first direction such as to cover at least a portion of the side end of the side cover, and the ground member may be between the side end of the side cover and the light absorbing end member.

BRIEF DESCRIPTION OF THE DRAWINGS

The above and other aspects, features, and advantages of certain embodiments of the present disclosure will be more apparent from, taken in conjunction with the accompanying drawings of which.

DETAILED DESCRIPTION

Figure 1:
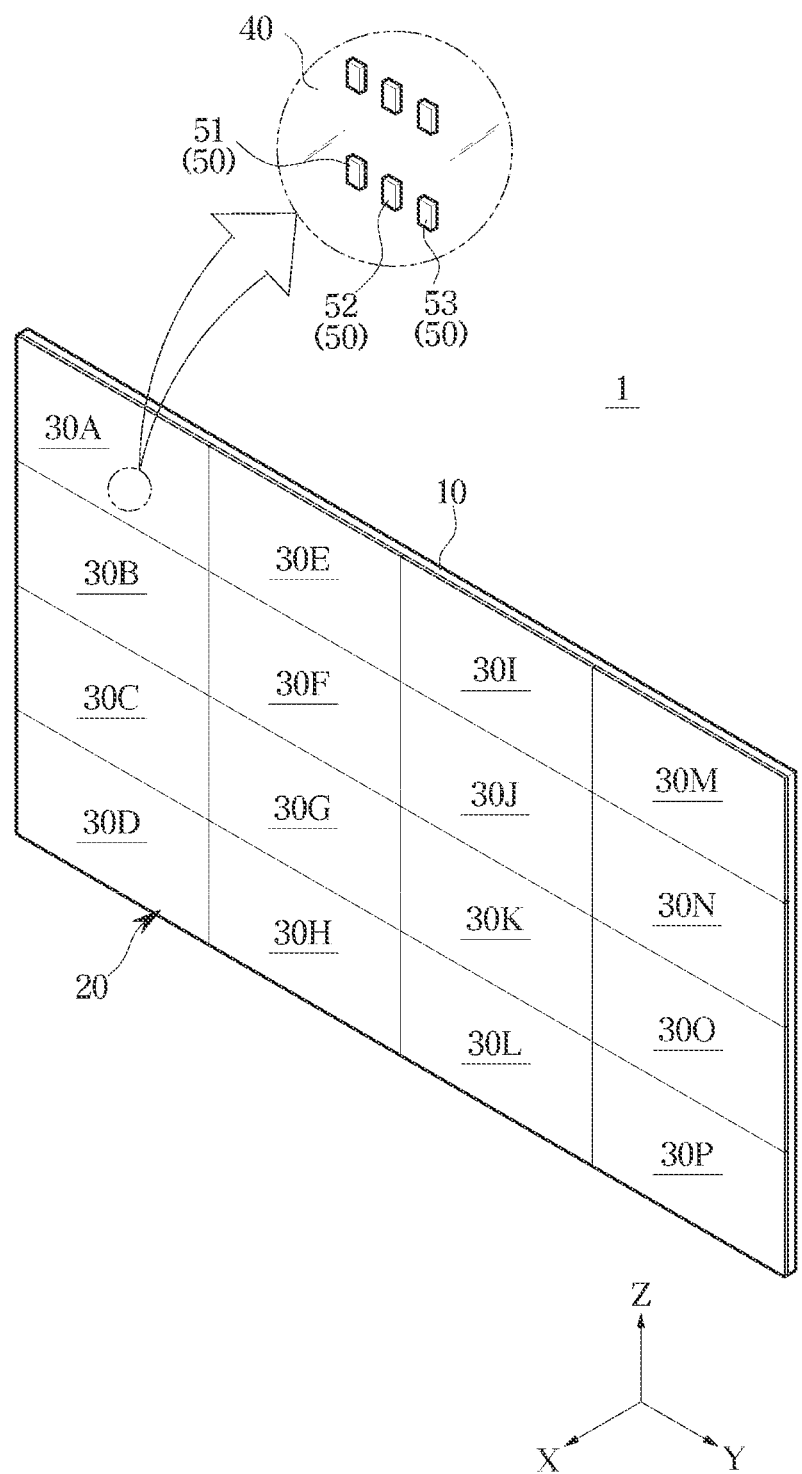
FIG. 1 is a view illustrating a display apparatus according to an embodiment of the disclosure.

Embodiments described in the disclosure and configurations shown in the drawings are merely examples of the embodiments of the disclosure, and the scope of the disclosure should be understood to include various modifications and equivalents of the embodiments at the time of filing of the present application.

The singular forms "a," "an" and "the" are intended to include the plural forms as well, unless the context clearly indicates otherwise. The shapes and sizes of elements in the drawings may be exaggerated for the clear description.

In this disclosure, the terms "including", "comprising, "having", and the like are used to specify features, numbers, steps, operations, elements, components, or combinations thereof, but do not preclude the presence or addition of one or more of the features, elements, steps, operations, elements, components, or combinations thereof.

Also, in the present description, the meaning of "identical" includes things that are similar to each other in properties or are similar within a certain range. Also, "identical" means "substantially identical". It should be understood that "substantially identical" means that a value corresponding to differences within a negligible range with respect to a reference value or a numerical value corresponding to a manufacturing error range are included in the range of "identical".

Hereinafter, non-limiting example embodiments according to the disclosure will be described in detail with reference to the accompanying drawings.

Figure 2:
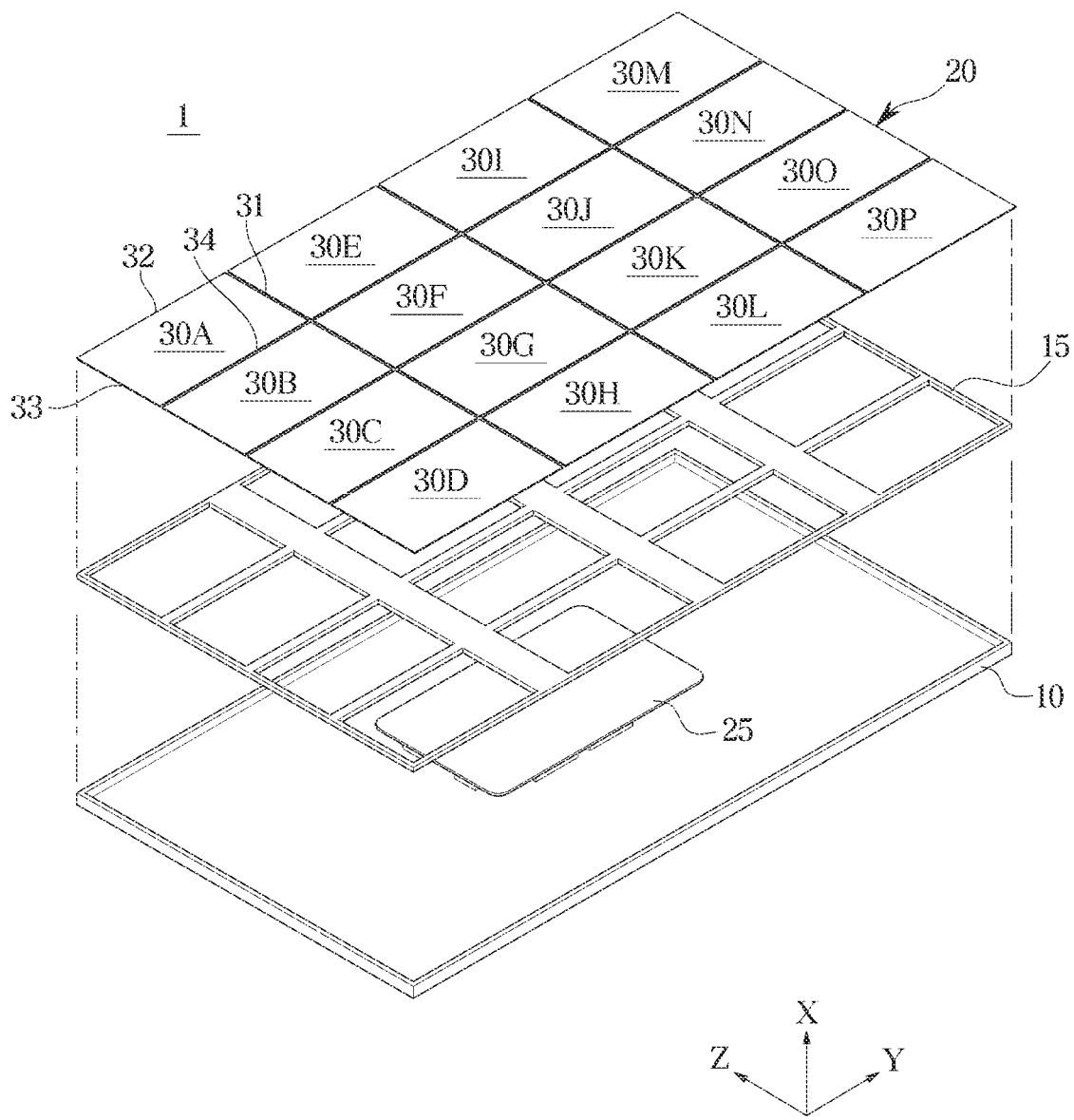
FIG. 2 is an exploded-view illustrating a main configuration of the display apparatus shown in FIG. 1.
Figure 3:
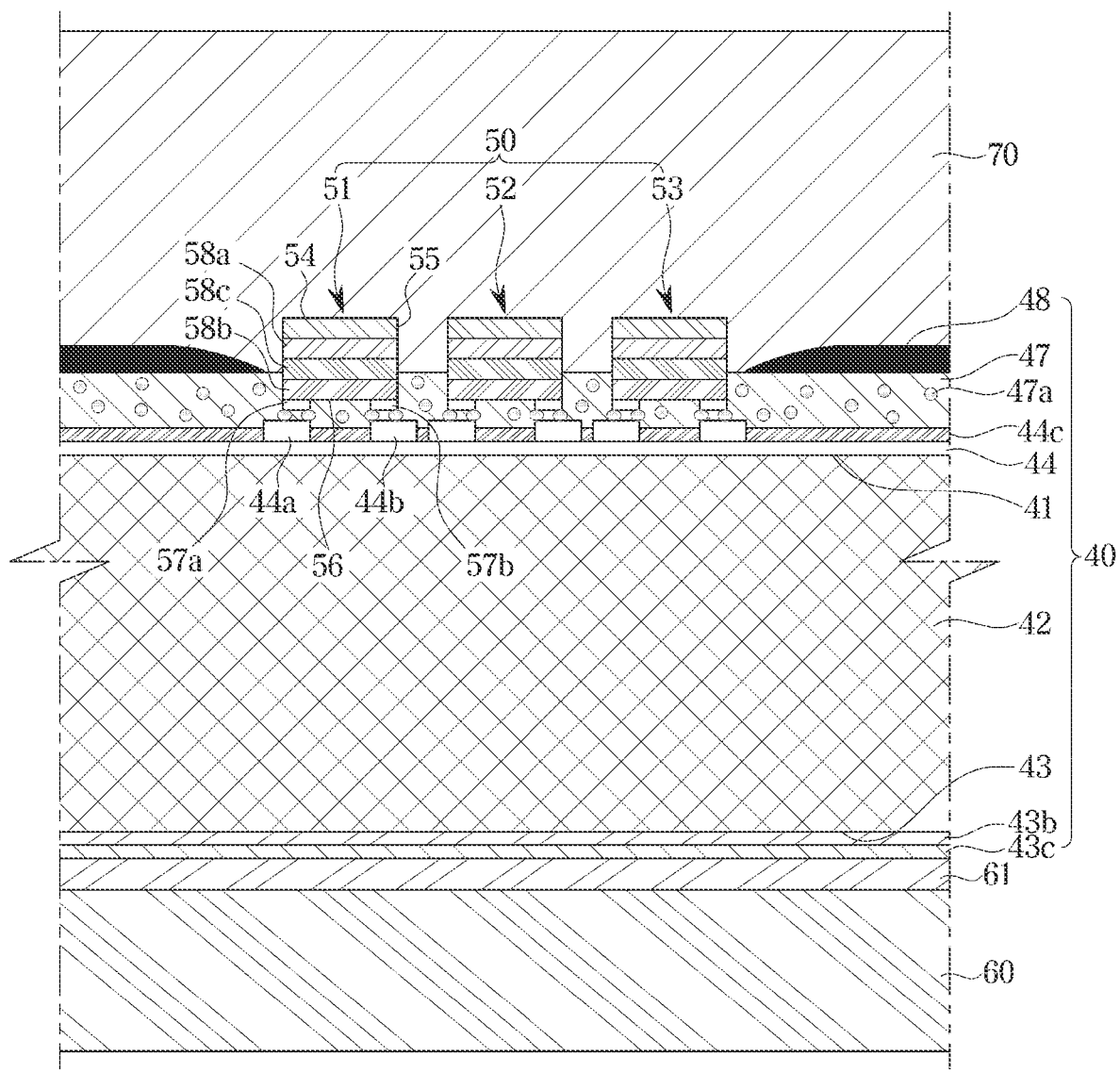
FIG. 3 is an enlarged cross-sectional view illustrating a part of one display module shown in FIG. 1.
Figure 4:
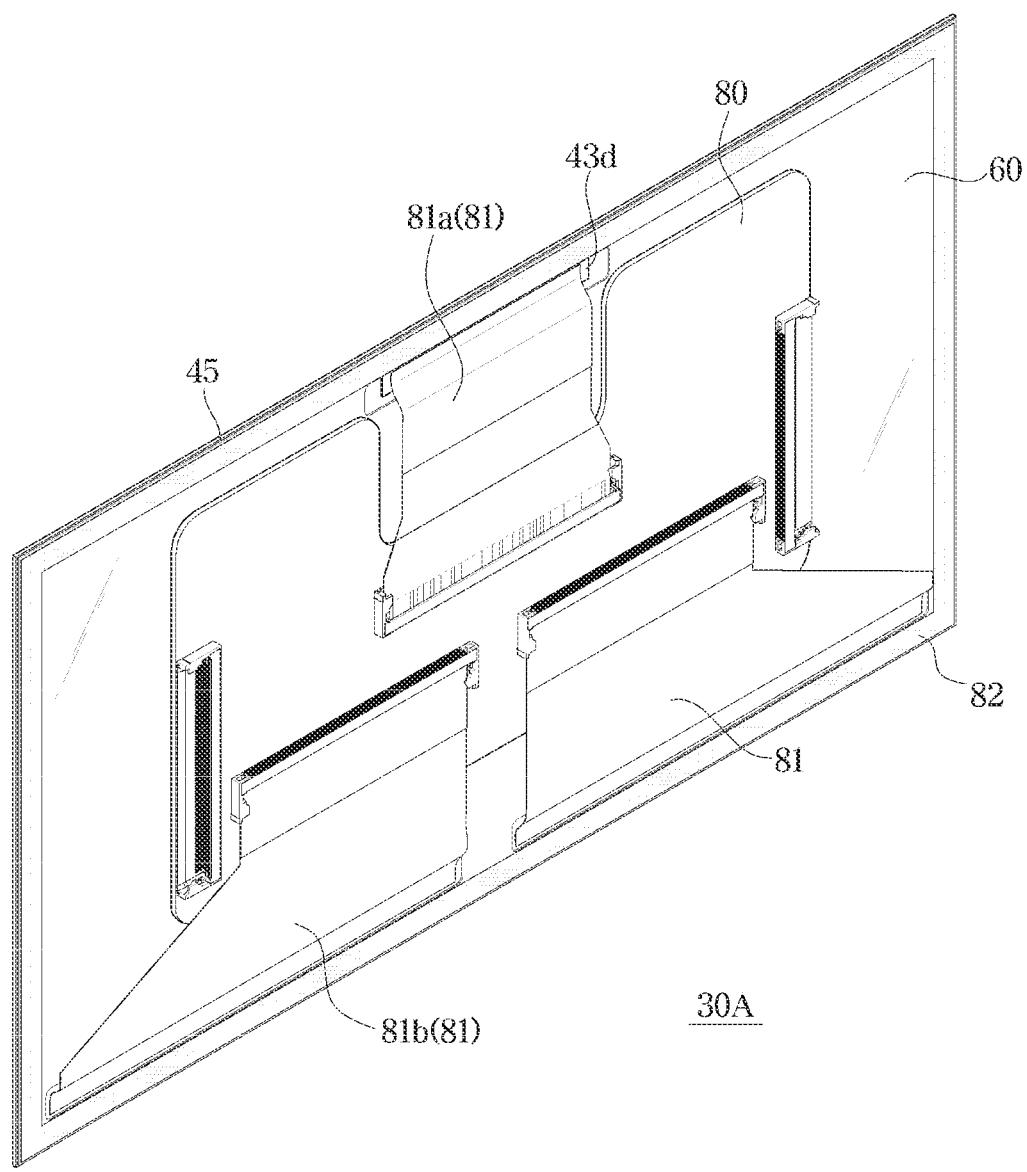
FIG. 4 is a rear perspective view illustrating the display module of the display apparatus shown in FIG. 1.
Figure 5:
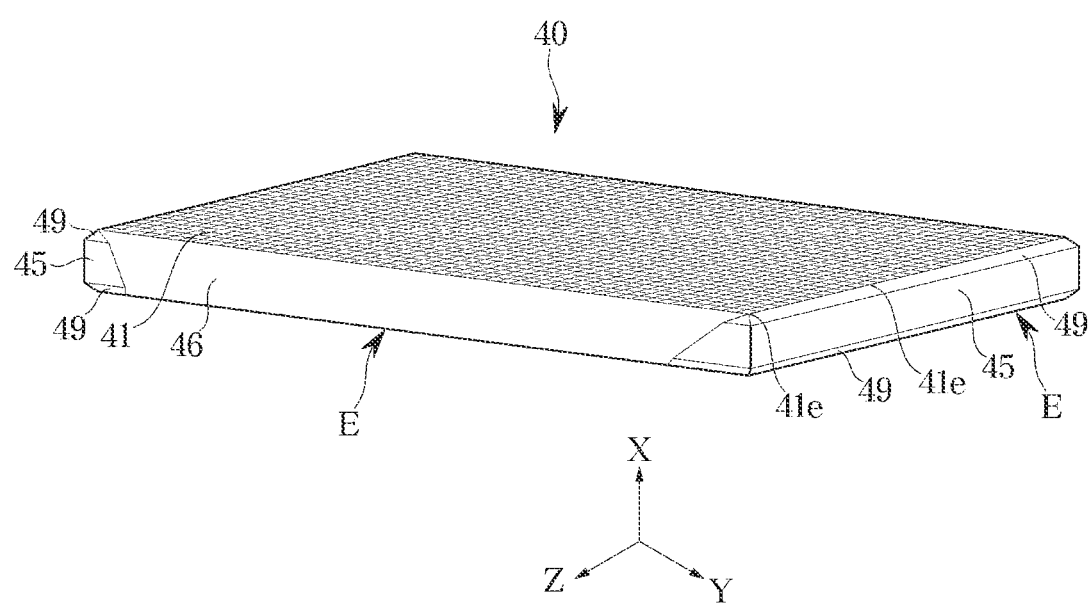
FIG. 5 is a perspective view illustrating a part of the configuration of the display module shown in FIG. 1.

FIG. 1 is a view illustrating a display according to an embodiment of the disclosure, FIG. 2 is an exploded-view illustrating a main configuration of the display apparatus shown in FIG. 1, FIG. 3 is an enlarged cross-sectional view illustrating a part of one display module shown in FIG. 1, FIG. 4 is a rear perspective view illustrating the display module of the display apparatus shown in FIG. 1, and FIG. 5 is a perspective view illustrating a part of the configuration of the display module shown in FIG. 1.

A part of a configuration of a display apparatus 1 as well as a plurality of inorganic light emitting devices 50 illustrated in the drawings is a component in a micro-unit having a size of several μm to hundreds of μm, and for convenience of description, some components (the plurality of inorganic light emitting devices 50 and a black matrix 48, etc.) are exaggerated.

The display apparatus 1 is a device that displays information, material, data, etc. as characters, figures, graphs, images, etc. and a television, a personal computer, mobile, and a digital signage may be implemented as the display apparatus 1.

According to an embodiment of the disclosure, as illustrated in FIGS. 1 and 2, the display apparatus 1 may include a display panel 20 provided to display an image, a power supply device (not shown) configured to supply power to the display panel 20, a main board 25 configured to control an overall operation of the display panel 20, a frame 15 provided to support the display panel 20, and a rear cover 10 provided to cover a rear surface of the frame 15.

The display panel 20 may include a plurality of display modules 30A-30P, a driver board (not shown) configured to drive each of the display modules 30A-30P, and a timing controller (T-con) board configured to generate a timing signal to control each of the display modules 30A-30P.

The rear cover 10 may support the display panel 20. The rear cover 10 may be installed on the floor through a stand (not shown), or may be installed on a wall through a hanger (not shown).

The plurality of display modules 30A-30P may be arranged vertically and horizontally to be adjacent to each other. The plurality of display modules 30A-30P may be arranged in an M*N matrix. In the embodiment, 16 display modules 30A-30P are provided and arranged in a matrix of 4*4, but there is no limitation in the number and arrangement method of the plurality of display modules 30A-30P.

The plurality of display modules 30A-30P may be installed in the frame 15. The plurality of display modules 30A-30P may be installed in the frame 15 through various known methods such as magnetic force using a magnet or a mechanical fitting structure. The rear cover 10 may be coupled to the rear of the frame 15, and the rear cover 10 may form a rear exterior of the display apparatus 1.

The rear cover 10 may include a metal material. Accordingly, heat generated from the plurality of display modules 30A-30P and the frame 15 may be easily conducted to the rear cover 10 to increase the heat dissipation efficiency of the display apparatus 1.

As described above, the display apparatus 1 according to the embodiment of the disclosure may implement a large screen by tiling the plurality of display modules 30A-30P.

Unlike the embodiment of the disclosure, a single display module from among the plurality of display modules 30A-30P may be applied to a display apparatus. That is, as a single unit, the display modules 30A-30P may be installed and applied in a wearable device, a portable device, a handheld device, and an electronic product or an electronic component that requires a display. According to embodiments of the disclosure, the plurality of display modules 30A-30P may be assembled in a matrix type and then applied to a display apparatus such as a monitor for a personal computer (PC), a high-resolution TV, a signage, and an electronic display.

The plurality of display modules 30A-30P may include the same configuration as each other. Accordingly, a description of any one display module described below may be equally applied to all other display modules.

Hereinafter each of the plurality of display modules 30A-30P will be described with reference to a first display module 30A because all of the plurality of display modules 30A-30P are formed identically.

That is, in order to avoid overlapping description, the first display module 30A, a substrate 40, and a front cover 70 will be described as representative of the configuration of the plurality of display modules 30A-30P.

In addition, among the plurality of display modules 30A-30P, the first display module 30A, a second display module 30E arranged adjacent to the first display module 30A in a second direction Y, or a third display module 30B arranged adjacent to the first display module 30A in a third direction Z will be described. In the disclosure, the second direction Y may also be referred to an axis that includes opposite directions (e.g., a Y direction and a −Y direction). In the disclosure, the third direction Z may also be referred to an axis that includes opposite directions (e.g., a Z direction and a −Z direction).

Among the plurality of display modules 30A-30P, the first display module 30A may be formed in a quadrangle type. Alternatively, the first display module 30A may be provided in a rectangular type or a square type.

Accordingly, the first display module 30A may include edges 31, 32, 33, and 34 formed in up, down, left, and right directions with respect to a first direction X, which is the front. In the disclosure, the first direction X may also be referred to an axis that includes opposite directions (e.g., an X direction and a −X direction).

As illustrated in FIG. 3, each of the plurality of display modules 30A-30P may include the substrate 40 and a plurality of inorganic light emitting devices 50 mounted on the substrate 40. The plurality of inorganic light emitting devices 50 may be mounted on a mounting surface 41 of the substrate 40 facing the first direction X. In FIG. 3, for convenience of description, a thickness of the substrate 40 in the first direction X is shown to be enlarged.

The substrate 40 may be formed in a quadrangle type. As described above, each of the plurality of display modules 30A-30P may be provided in a quadrangle type, and thus the substrate 40 may be formed in a quadrangle type to correspond to the type of the display module.

Alternatively, the substrate 40 may be provided in a rectangle type or a square type.

Therefore, as for the first display module 30A, the substrate 40 may include four edges E corresponding to the edges 31, 32, 33, and 34 of the first display module 30A formed in four directions of up, down, left, and right with respect to the first direction X that is the front (refer to FIG. 5).

The substrate 40 may include a substrate body 42, the mounting surface 41 forming one surface of the substrate body 42, a rear surface 43 arranged on the opposite side to the mounting surface 41 and forming another surface of the substrate body 42, and a side surface 45 arranged between the mounting surface 41 and the rear surface 43.

The side surface 45 may form a side end of the substrate 40 in the second direction Y and the third direction Z that are perpendicular to the first direction X.

The substrate 40 may include a chamfer 49 formed between the mounting surface 41 and the side surface 45 and between the rear surface 43 and the side surface 45.

The chamfer 49 may prevent the respective substrates from colliding and being damaged when the plurality of display modules 30A-30P is arranged.

The edge E of the substrate 40 is a concept including the side surface 45 and the chamfer 49.

The substrate 40 may include a thin film transistor (TFT) layer 44 formed on the substrate body 42 to drive the inorganic light emitting devices 50. The substrate body 42 may include a glass substrate. That is, the substrate 40 may include a Chip on Glass (COG) type substrate. The first pad electrode 44a and the second pad electrode 44b provided to electrically connect the inorganic light emitting devices 50 to the TFT layer 44 may be formed on the substrate 40.

A thin film transistor (TFT) forming the TFT layer 44 is not limited to a specific structure or type, and may be configured in various embodiments. That is, the TFT of the TFT layer 44 according to an embodiment of the disclosure may be implemented as an organic TFT and a graphene TFT as well as a Low Temperature Poly Silicon (LTPS) TFT, an oxide TFT, and a Si TFT such as a poly silicon, or a-silicon TFT.

Alternatively, based on the substrate body 42 of the substrate 40 being formed of a silicon wafer, the TFT layer 44 may be replaced with a Complementary Metal-Oxide Semiconductor (CMOS) transistor, an n-type metal-oxide semiconductor field-effect-transistor (MOSFET), or a p-type MOSFET.

The plurality of inorganic light emitting devices 50 may be formed of an inorganic material, and may include inorganic light emitting devices having sizes of several μm to several tens of μm in width, length, and height, respectively. The micro-inorganic light emitting device may have a length of 100 μm or less on a short side among width, length, and height. That is, the inorganic light emitting devices 50 may be picked up from a sapphire or silicon wafer and directly transferred onto the substrate 40. The plurality of inorganic light emitting devices 50 may be picked up and transported through an electrostatic method using an electrostatic head or a stamp method using an elastic polymer material such as Polydimethylsiloxane (PDMS) or silicon as a head.

The plurality of inorganic light emitting devices 50 may be a light emitting structure including an n-type semiconductor 58a, an active layer 58c, a p-type semiconductor 58b, a first contact electrode 57a, and a second contact electrode 57b.

Although not shown in FIG. 3, one from among the first contact electrode 57a and the second contact electrode 57b may be electrically connected to the n-type semiconductor 58a and the other from among the first contact electrode 57a and the second contact electrode 57b may be electrically connected to the p-type semiconductor 58b.

The first contact electrode 57a and the second contact electrode 57b may be a flip chip type in which the first contact electrode 57a and the second contact electrode 57b are horizontally arranged to face the same direction (a direction opposite to an emission direction).

The inorganic light emitting devices 50 may include a light emitting surface 54 arranged to face the first direction X, a side surface 55, and a bottom surface 56 arranged to be opposite to the light emitting surface 54, which are based on arrangement in which the inorganic light emitting devices 50 are mounted on the mounting surface 41. The first contact electrode 57a and the second contact electrode 57b may be formed on the bottom surface 56.

That is, the first contact electrode 57a and the second contact electrode 57b of the inorganic light emitting devices 50 may be arranged on the side opposite of the light emitting surface 54, and accordingly, the first contact electrode 57a and the second contact electrode 57b may be arranged on the opposite side to the direction in which light is emitted.

The first contact electrode 57a and the second contact electrode 57b may be arranged to face the mounting surface 41, and provided to be electrically connected to the TFT layer 44. The light emitting surface 54 emitting light may be arranged in a direction opposite to the direction in which the first contact electrode 57a and the second contact electrode 57b are arranged.

Therefore, in response to light that is generated from the active layer 58c and emitted in the first direction X through the light emitting surface 54, the light may be emitted toward the first direction X without the interference of the first contact electrode 57a or the second contact electrode 57b.

That is, the first direction X may be defined as a direction in which the light emitting surface 54 is arranged to emit light.

The first contact electrode 57a and the second contact electrode 57b may be electrically connected to a first pad electrode 44a and a second pad electrode 44b, respectively, formed on the mounting surface 41 side of the substrate 40.

The inorganic light emitting devices 50 may be directly connected to the first pad electrode 44a and the second pad electrode 44b through an anisotropic conductive layer 47 or a bonding structure such as solder.

The anisotropic conductive layer 47 may be formed on the substrate 40 to mediate electrical bonding between the first contact electrode 57a and the second contact electrode 57b and the first pad electrode 44a and the second pad electrode 44b. The anisotropic conductive layer 47 may include a structure in which an anisotropic conductive adhesive is attached on a protective film, and particularly, a structure in which conductive balls 47a are dispersed in an adhesive resin. Each of the conductive balls 47a may be a conductive sphere surrounded by a thin insulating film, and may electrically connect conductors to each other as the insulating film is broken by pressure.

The anisotropic conductive layer 47 may include an anisotropic conductive film (ACF) in the form of a film and an anisotropic conductive paste (ACP) in the form of a paste.

In the embodiment according to the disclosure, the anisotropic conductive layer 47 may be provided with an anisotropic conductive film.

Therefore, by a pressure applied to the anisotropic conductive layer 47 in a state in which the plurality of inorganic light emitting devices 50 is mounted on the substrate 40, the insulating film of the conductive balls 47a may be broken and thus the first contact electrode 57a and the second contact electrode 57b of the inorganic light emitting devices 50 may be electrically connected to the first pad electrode 44a and the second pad electrode 44b of the substrate 40.

According to embodiments of the disclosure, the plurality of inorganic light emitting devices 50 may be mounted on the substrate 40 through solder (not shown) instead of the anisotropic conductive layer 47. After the inorganic light emitting devices 50 are aligned on the substrate 40, the inorganic light emitting devices 50 may be bonded to the substrate 40 through a reflow process.

The plurality of inorganic light emitting devices 50 may include a red light emitting device 51, a green light emitting device 52, and a blue light emitting device 53. As for the inorganic light emitting devices 50, a series of the red light emitting device 51, the green light emitting device 52, and the blue light emitting device 53 may be mounted on the mounting surface 41 of the substrate 40 as one unit. A series of the red light emitting device 51, the green light emitting device 52, and the blue light emitting device 53 may form a single pixel. In this case, the red light emitting device 51, the green light emitting device 52, and the blue light emitting device 53 may each form a respective sub pixel.

The red light emitting device 51, the green light emitting device 52, and the blue light emitting device 53 may be arranged in a line at a predetermined interval according to the embodiment of the disclosure, and alternatively, arranged in other shapes such as a triangular shape.

The substrate 40 may include a light absorbing layer 44c to absorb external light to improve contrast. The light absorbing layer 44c may be formed on the entire mounting surface 41 of the substrate 40. The light absorbing layer 44c may be formed between the TFT layer 44 and the anisotropic conductive layer 47.

The plurality of display modules 30A-30P may further include a black matrix 48 formed between the plurality of inorganic light emitting devices 50.

The black matrix 48 may perform a function of supplementing the light absorbing layer 44c formed entirely on the mounting surface 41 side of the substrate 40. That is, the black matrix 48 may absorb external light to allow the substrate 40 to appear black, thereby improving the contrast of the screen.

It is appropriate that the black matrix 48 has a black color.

According to the embodiment, the black matrix 48 may be arranged between pixels formed by a series of the red light emitting device 51, the green light emitting device 52, and the blue light emitting device 53. According to other embodiments of the disclosure, the black matrix 48 may be formed more precisely to partition each of the red light emitting device 51, the green light emitting device 52, and the blue light emitting device 53 corresponding to the sub-pixels.

The black matrix 48 may be formed in a grid shape having a horizontal pattern and a vertical pattern to be arranged between pixels.

The black matrix 48 may be formed by applying a light-absorbing ink on the anisotropic conductive layer 47 and then curing the light-absorbing ink through an ink-jet process, or by coating a light-absorbing film on the anisotropic conductive layer 47.

That is, on the anisotropic conductive layer 47 formed entirely on the mounting surface 41, the black matrix 48 may be arranged on a space, in which the plurality of inorganic light emitting devices 50 is not mounted, between the plurality of inorganic light emitting devices 50.

The plurality of display modules 30A-30P may include a front cover 70 arranged in the first direction X on the mounting surface 41 to cover the mounting surface 41 of the plurality of display modules 30A-30P.

Figure 6:
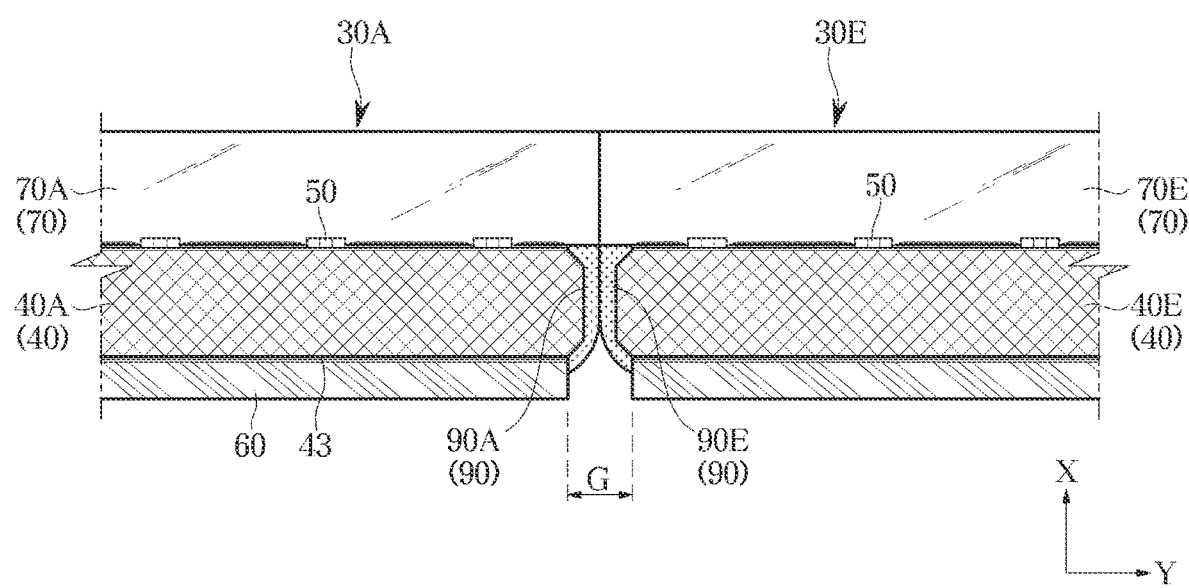
FIG. 6 is a cross-sectional view illustrating a part of the configuration of the display apparatus shown in FIG. 1 with respect to a second direction.
Figure 7:
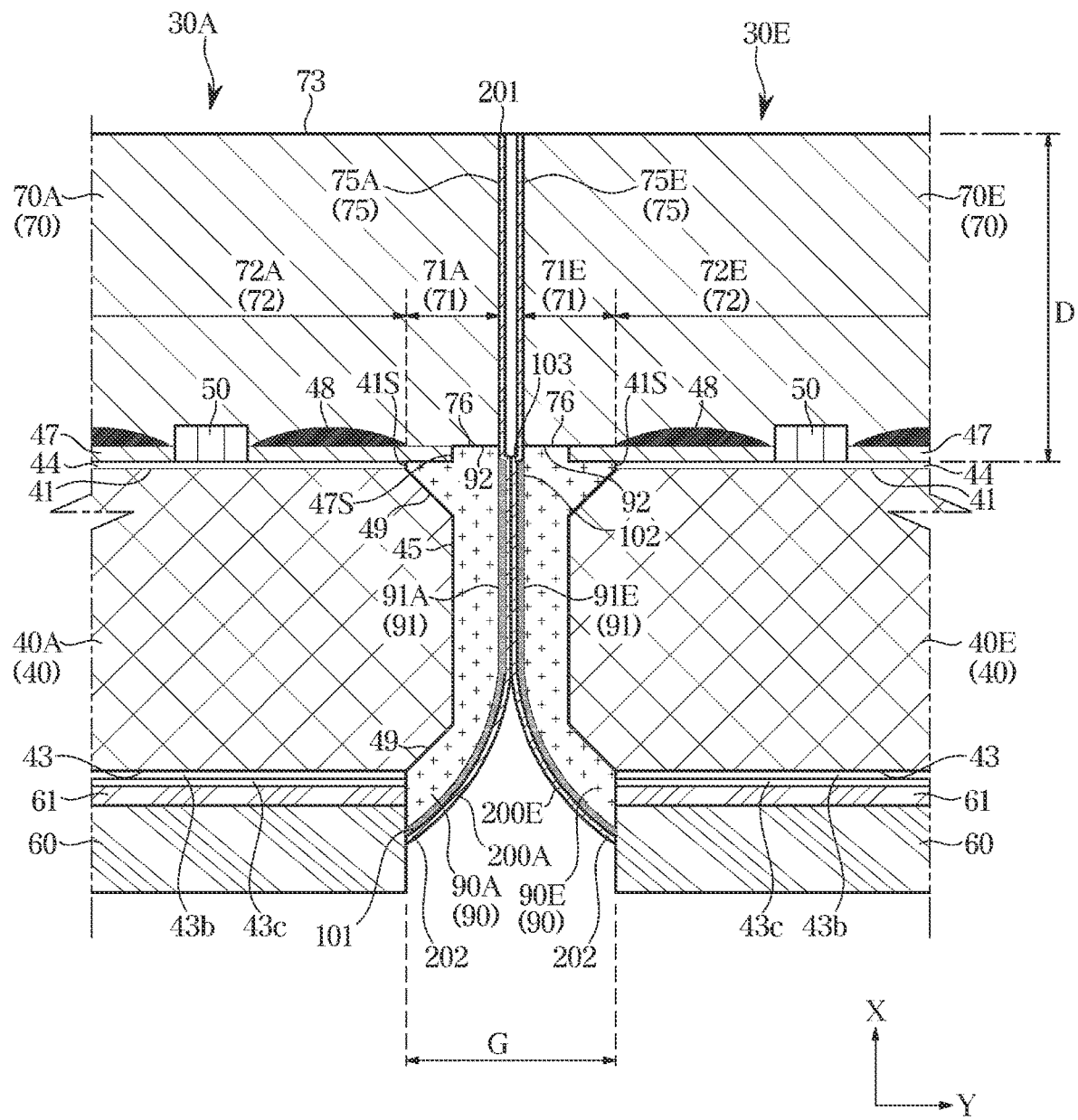
FIG. 7 is an enlarged cross-sectional view illustrating a part of the configuration shown in FIG. 6.

The front cover 70 may be provided in plurality so as to be respectively formed in the first direction X on the plurality of display modules 30A-30P (refer to FIGS. 6 and 7).

Each of the plurality of display modules 30A-30P may be assembled after a separate front cover 70 is formed. That is, as for the first display module 30A and the second display module 30E among the plurality of display modules 30A-30P, a first front cover 70A may be formed on the mounting surface 41 of the first display module 30A and a second front cover 70E may be formed on the mounting surface 41 of the second display module 30E.

The front cover 70 may be provided to cover the substrate 40 to protect the substrate 40 from external force or external moisture.

A plurality of layers (not shown) of the front cover 70 may be provided as a functional film having optical performance. This will be described later in detail.

A part of the plurality of layers (not shown) of the front cover 70 may include a base layer (not shown) formed of optical clear resin (OCR). The base layer (not shown) may be provided to support a plurality of other layers (not shown). The OCR may be in a relatively transparent state having a transmittance of 90% or more.

The OCR may improve visibility and image quality by increasing transmittance through low reflection properties. That is, in a structure including an air gap, light loss may occur due to the difference in a refractive index between the film layer and the air layer. However, in a structure including the OCR, the difference in a refractive index may be reduced and thus light-loss may also be reduced, thereby improving visibility and image quality.

That is, the OCR may improve image quality as well as protecting the substrate 40.

A part of the plurality of layers (not shown) may include an adhesive layer (not shown) provided to bond the front cover 70 to the mounting surface 41 of the substrate 40.

According to embodiments of the disclosure, the front cover 70 may be provided to include a predetermined height or more in the first direction X to which the mounting surface 41 or the light emitting surface 54 faces.

This is to sufficiently fill a gap that may be formed between the front cover 70 and the plurality of inorganic light emitting devices 50 when the front cover 70 is formed on the substrate 40.

In addition, each of the plurality of display modules 30A-30P may include a rear adhesive tape 61 arranged between the rear surface 43 and a metal plate 60 to bond the metal plate 60 to the rear surface 43 of the substrate 40.

The rear adhesive tape 61 may be provided as a double-sided adhesive tape, but is not limited thereto, and may be provided in the form of an adhesive layer instead of a tape shape. That is, the rear adhesive tape 61 is an example of a medium for bonding the metal plate 60 to the rear surface 43 of the substrate 40, and is not limited to the tape. The rear adhesive tape 61 may be provided in various medium shapes.

The plurality of inorganic light emitting devices 50 may be electrically connected to a pixel driving wiring (not shown) formed on the mounting surface 41, and an upper wiring layer (not shown) extending through the side surface 45 of the substrate 40 and formed as a pixel driving wiring (not shown).

The upper wiring layer (not shown) may be formed under the anisotropic conductive layer 47. The upper wiring layer (not shown) may be electrically connected to a side wiring 46 (refer to FIG. 5) formed on the side surface 45 of the substrate 40. The side wiring 46 may be provided in the form of a thin film.

When it is assumed that with respect to the first direction X facing the front of the display apparatus 1, a direction perpendicular to the first direction X and corresponding to the left and right direction of the display apparatus 1 is defined as the second direction Y, and a direction perpendicular to the first direction X and the second direction Y, and corresponding to the up and down direction of the display apparatus 1 is defined as the third direction Z, the side wiring 46 may extend to the rear surface 43 of the substrate 40 along the chamfer 49 and the side surface 45 of the substrate 40 in the third direction Z, along the third direction Z.

However, embodiments of the disclosure are not limited thereto and the side wiring 46 may extend to the rear surface 43 of the substrate 40 along the chamfer 49 and the side surface 45 of the substrate 40 in the second direction Y, along the second direction Y.

According to an embodiment of the disclosure, the side wiring 46 may extend along one edge E (refer to FIG. 5) of the substrate 40 corresponding to the upper edge 32 and the lower edge 34 (refer to FIG. 2) of the first display module 30A.

However, embodiment of the disclosure are not limited thereto, and the side wiring 46 may extend along one edge E of the substrate 40 corresponding to at least two edges among four edges 31, 32, 33 and 34 of the first display module 30A.

The upper wiring layer (not shown) may be connected to the side wiring 46 by an upper connection pad (not shown) formed on the edge E side of the substrate 40.

The side wiring 46 may extend along the side surface 45 of the substrate 40 and may be connected to a rear wiring layer 43b formed on the rear surface 43.

An insulating layer 43c covering the rear wiring layer 43b may be formed on the rear wiring layer 43b in a direction to which the rear surface of the substrate 40 faces.

That is, the plurality of inorganic light emitting devices 50 may be sequentially and electrically connected to the upper wiring layer (not shown), the side wiring 46, and the rear wiring layer 43b.

Further, as illustrated in FIG. 4, the first display module 30A may include a driver circuit board 80 provided to electrically control the plurality of inorganic light emitting devices 50 mounted on the mounting surface 41. The driver circuit board 80 may be formed of a printed circuit board. The driver circuit board 80 may be arranged on the rear surface 43 of the substrate 40 in the first direction X. The driver circuit board 80 may be arranged on the metal plate 60 bonded to the rear surface 43 of the substrate 40.

The first display module 30A may include a flexible film 81 connecting the driver circuit board 80 to the rear wiring layer 43b to allow the driver circuit board 80 to be electrically connected to the plurality of inorganic light emitting devices 50.

Particularly, one end of the flexible film 81 may be connected to a rear connection pad 43d arranged on the rear surface 43 of the substrate 40 and electrically connected to the plurality of inorganic light emitting devices 50.

The rear connection pad 43d may be electrically connected to the rear wiring layer 43b. Accordingly, the rear connection pad 43d may electrically connect the rear wiring layer 43b to the flexible film 81.

Because the flexible film 81 is electrically connected to the rear connection pad 43d, the flexible film 81 may transmit power and an electrical signal from the driver circuit board 80 to the plurality of inorganic light emitting devices 50.

The flexible film 81 may be formed of a flexible flat cable (FFC) or a chip on film (COF).

The flexible film 81 may include a first flexible film 81a and a second flexible film 81b that are respectively arranged in the up and down direction with respect to the first direction X.

The first flexible film 81a and the second flexible film 81b are not limited thereto, and may be arranged in the left and right directions with respect to the first direction X, or may be arranged in at least two directions in the up, down, left, and right directions, respectively.

The second flexible film 81b may be provided in plural. However, embodiments of the disclosure are not limited thereto, and a single second flexible film 81b may be provided, and the first flexible film 81a may also be provided in plural.

The first flexible film 81a may transmit a data signal from the driver circuit board 80 to the substrate 40. The first flexible film 81a may be formed of COF.

The second flexible film 81b may transmit power from the driver circuit board 80 to the substrate 40. The second flexible film 81b may be formed of FFC.

However, embodiments of the disclosure are not limited thereto, and the first flexible film 81a may transmit power from the driver circuit board 80 to the substrate 40 and be formed of FFC, and the second flexible film 81b may transmit a data signal from the driver circuit board 80 to the substrate 40 and be formed of COF.

Although not shown in the drawings, the driver circuit board 80 may be electrically connected to a main board 25 (refer to FIG. 2). The main board 25 may be arranged on the rear side of the frame 15. At the rear of the frame 15, the main board 25 may be connected to the driver circuit board 80 through a cable (not shown).

As described above, the metal plate 60 may be provided to be in contact with the substrate 40. The metal plate 60 and the substrate 40 may be bonded to each other by the rear adhesive tape 61 arranged between the rear surface 43 of the substrate 40 and the metal plate 60.

The metal plate 60 may be formed of a metal material having high thermal conductivity. For example, the metal plate 60 may be formed of an aluminum material.

Heat generated by the plurality of inorganic light emitting devices 50 mounted to the substrate 40 and the TFT layer 44 may be transferred to the metal plate 60 through the rear adhesive tape 61 along the rear surface 43 of the substrate 40.

Accordingly, heat generated by the substrate 40 may be easily transferred to the metal plate 60 and it is possible to prevent a temperature of the substrate 40 from being greater than or equal to a predetermined temperature.

The plurality of display modules 30A-30P may be arranged in various positions in the form of an M*N matrix. Each of the display modules 30A-30P is provided to be individually movable. In this case, each of the display modules 30A-30P may include the metal plate 60 to maintain a certain level of heat dissipation performance regardless of a position in which each of the display modules 30A-30P is arranged.

The plurality of display modules 30A-30P may be provided in the form of various M*N matrixes so as to form various-sized screen of the display apparatus 1. Accordingly, in comparison with the heat dissipation through a single metal plate provided for the heat dissipation, each of the display modules 30A-30P according to an embodiment of the disclosure may include an independent metal plate 60 so as to individually dissipate the heat, thereby improving the heat dissipation performance of the entire display apparatus 1.

According to a comparative embodiment in which only a single metal plate is arranged inside the display apparatus 1, a part of the metal plate may be arranged at a position corresponding to a position where none of the display modules are arranged in the front and rear direction. Therefore, the heat dissipation efficiency of the display apparatus 1 may be reduced in the comparative embodiment.

In contrast, regardless of the position of the display modules 30A-30P, the display modules 30A-30P may perform self-heat dissipation by their respective metal plate 60, arranged on the display modules 30A-30P, and thus it is possible to improve the heat dissipation performance of the entire display apparatus 1 according to embodiments of the disclosure.

The metal plate 60 may be provided in a quadrangular shape substantially corresponding to the shape of the substrate 40.

An area of the substrate 40 may be at least equal to or greater than an area of the metal plate 60. In response to the substrate 40 and the metal plate 60 being arranged side by side in the first direction X, the four edges of the substrate 40 having a rectangular shape may be formed to correspond to the four edges of the metal plate 60 with respect to the center of the substrate 40 and the metal plate 60, or the four edges of the substrate 40 having a rectangular shape may be formed to be arranged outwards from the four edges of the metal plate 60 with respect to the center of the substrate 40 and the metal plate 60.

It is appropriate that the four edges E of the substrate 40 is provided to be arranged outside the four edges of the metal plate 60. That is, the area of the substrate 40 may be provided to be greater than the area of the metal plate 60.

The substrate 40 and the metal plate 60 may be thermally expanded by heat transferred to each of the display modules 30A-30P. Because the metal plate 60 has a higher coefficient of thermal expansion than the substrate 40, a value at which the metal plate 60 expands is greater than a value at which the substrate 40 is expanded.

In this case, in response to the four edges E of the substrate 40 being formed to correspond to the four edges of the metal plate 60 or being arranged inwards from the four edges of the metal plate 60 in a comparative embodiment, the edge of the metal plate 60 may protrude to the outside of the substrate 40.

Accordingly, a separation distance between gaps formed between the respective display modules 30A-30P may be irregularly formed by the thermal expansion of the metal plate 60 of each of the display modules 30A-30P in the comparative embodiment. Therefore, some of seams may be easily recognized and thus the integrity of the screen of the display panel 20 may be reduced in the comparative embodiment.

However, in embodiments of the disclosure, even when the substrate 40 and the metal plate 60 are thermally expanded, the metal plate 60 may not protrude to the outside of the four edges E of the substrate 40 because the four edges E of the substrate 40 is arranged outside the four edges of the metal plate 60. Accordingly, the separation distance of the gap formed between the display modules 30A-30P may be constantly maintained in embodiments of the disclosure.

In addition, in order to maintain a constant separation distance of the gap formed between the display modules 30A-30P, the frame 15 supporting the display modules 30A-30P may include a front surface having a material property similar to the substrate 40. That is, each of the display modules 30A-30P may be bonded to the front surface of the frame 15.

According to an embodiment of the disclosure, an area of the substrate 40 may be provided to substantially correspond to the area of the metal plate 60. Accordingly, heat generated from the substrate 40 may be evenly dissipated in the entire region of the substrate 40 without being isolated to a partial region.

The metal plate 60 may be bonded to the rear surface 43 of the substrate 40 by the rear adhesive tape 61.

The rear adhesive tape 61 may have a size corresponding to a size of the metal plate 60. That is, the area of the rear adhesive tape 61 may be provided to correspond to the area of the metal plate 60. The metal plate 60 may be provided in a substantially quadrangular shape, and the rear adhesive tape 61 may be provided in a quadrangular shape to correspond to the shape of the metal plate 60.

The edge of the metal plate 60 and the edge of the rear adhesive tape 61 in the rectangular shape may be formed to correspond to each other with respect to the center of the metal plate 60 and the rear adhesive tape 61.

Accordingly, the metal plate 60 and the rear adhesive tape 61 may be easily manufactured in a single coupling configuration, and thus it is possible to increase the manufacturing efficiency of the entire display apparatus 1.

That is, in response to the metal plate 60 being cut from one plate into a unit number, the rear adhesive tape 61 may be pre-bonded to one plate before the metal plate 60 is cut, and thus the rear adhesive tape 61 and the metal plate 60 may be simultaneously cut into a unit number, thereby reducing the process.

Heat generated by the substrate 40 may be transferred to the metal plate 60 through the rear adhesive tape 61. Accordingly, the rear adhesive tape 61 may be provided to bond the metal plate 60 to the substrate 40 while transferring the heat generated by the substrate 40 to the metal plate 60.

Accordingly, the rear adhesive tape 61 may include a material having high heat dissipation performance.

According to embodiments of the disclosure, the rear adhesive tape 61 may include a material having an adhesive property to bond the substrate 40 and the metal plate 60.

Additionally, the rear adhesive tape 61 may include a material having higher heat dissipation performance than a material having general adhesive properties. Accordingly, heat may be efficiently transferred from between the substrate 40 and the metal plate 60 to each component.

In addition, the material having the adhesive property of the rear adhesive tape 61 may be formed of a material having higher heat dissipation performance than the adhesive material forming the general adhesive.

A material having higher heat dissipation performance means a material that effectively transfers heat with high thermal conductivity, high heat transfer, and low specific heat.

For example, the rear adhesive tape 61 may include a graphite material. However, embodiments of the disclosure are not limited thereto, and the rear adhesive tape 61 may be generally formed of a material having high heat dissipation performance.

Flexibility of the rear adhesive tape 61 may be greater than flexibility of the substrate 40 and flexibility of the metal plate 60. Accordingly, the rear adhesive tape 61 may be formed of a material having high flexibility as well as an adhesive property and heat dissipation property. The rear adhesive tape 61 may be formed of an inorganic double-sided tape. As described above, the rear adhesive tape 61 is formed of an inorganic tape, and thus the rear adhesive tape 61 may be provided as a single layer in which a base material, which supports one surface bonded to the substrate 40 and the other surface bonded to the metal plate 60 (e.g., a heat dissipation member), is not provided between the one surface and the other surface.

Because the rear adhesive tape 61 does not include a base material, the rear adhesive tape 61 may not include a material that interferes with heat conduction, thereby increasing the heat dissipation performance. However, the rear adhesive tape 61 is not limited to the inorganic double-sided tape, and may be provided as a heat-dissipating tape having better heat dissipation performance than a general double-sided tape.

The rear adhesive tape 61 may be formed of a material with high flexibility so as to absorb the external force transmitted from the substrate 40 and the metal plate 60. Particularly, the flexibility of the rear adhesive tape 61 may be greater than flexibility of the substrate 40 and the metal plate 60.

Accordingly, in response to the external force, which is generated by the size change of the substrate 40 and the metal plate 60, being transmitted to the rear adhesive tape 61, the rear adhesive tape 61 itself may be deformed and thus the rear adhesive tape 61 may prevent the external force from being transmitted to different configurations.

The rear adhesive tape 61 may have a predetermined thickness in the first direction X. In response to the state of the rear adhesive tape 61 being expanded by the heat or being contracted, the metal plate 60 may be expanded or contracted in a direction perpendicular to the first direction X, as well as the first direction X and thus the external force may be transmitted to the substrate 40.

As described above, the metal plate 60 is formed to have a size corresponding to a size of the substrate 40 and is provided to cover the entire rear surface 43 of the substrate 40, and thus a fixing member 82 (refer to FIG. 4) may be arranged on the rear surface of the metal plate 60.

However, embodiments of the disclosure are not limited thereto, and the fixing member 82 may be provided to be arranged on the rear surface 43 of the substrate 40. In this case, the substrate 40 may be directly bonded to the frame 15 through the fixing member 82.

According to other embodiments of the disclosure, the metal plate 60 may be provided to cover a portion of the rear surface 43 of the substrate 40, and on the rear surface 43 of the substrate 40, the fixing member 82 may be bonded to a region that is not covered by the metal plate 60.

It is appropriate that the fixing member 82 is provided with a double-sided tape.

Hereinafter the front cover 70, a side cover 90, a ground member 100 and a light absorbing end member 200 will be described in detail.

Figure 8:
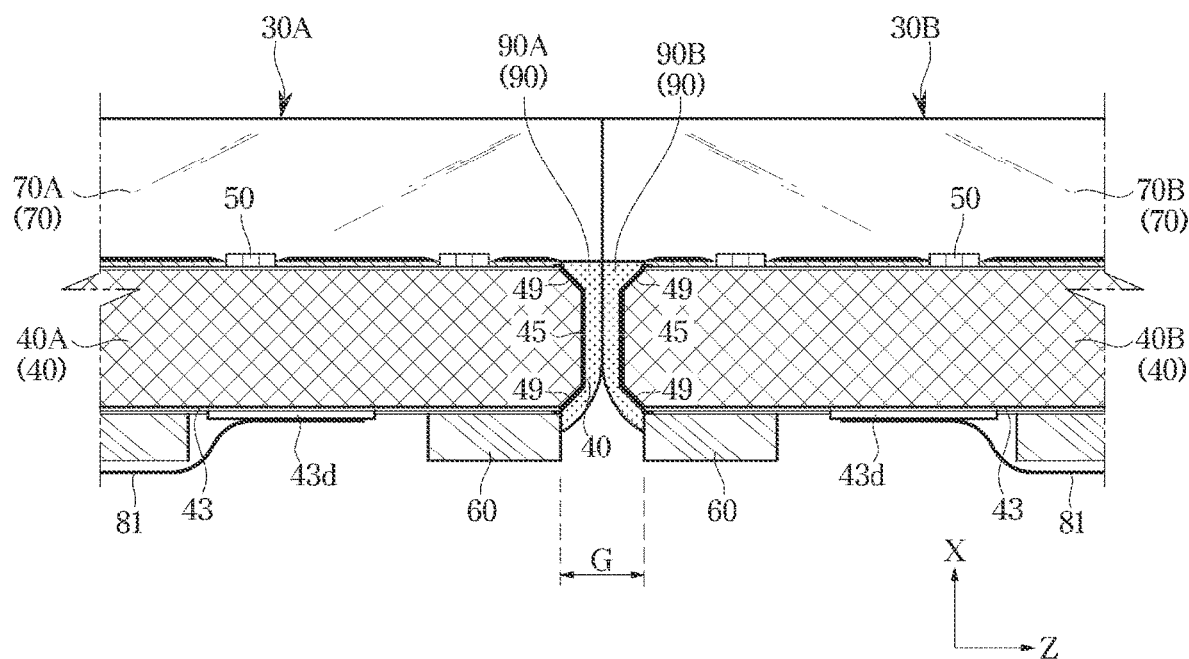
FIG. 8 is a cross-sectional view illustrating a part of the configuration of the display apparatus shown in FIG. 1 with respect to a third direction.
Figure 9:
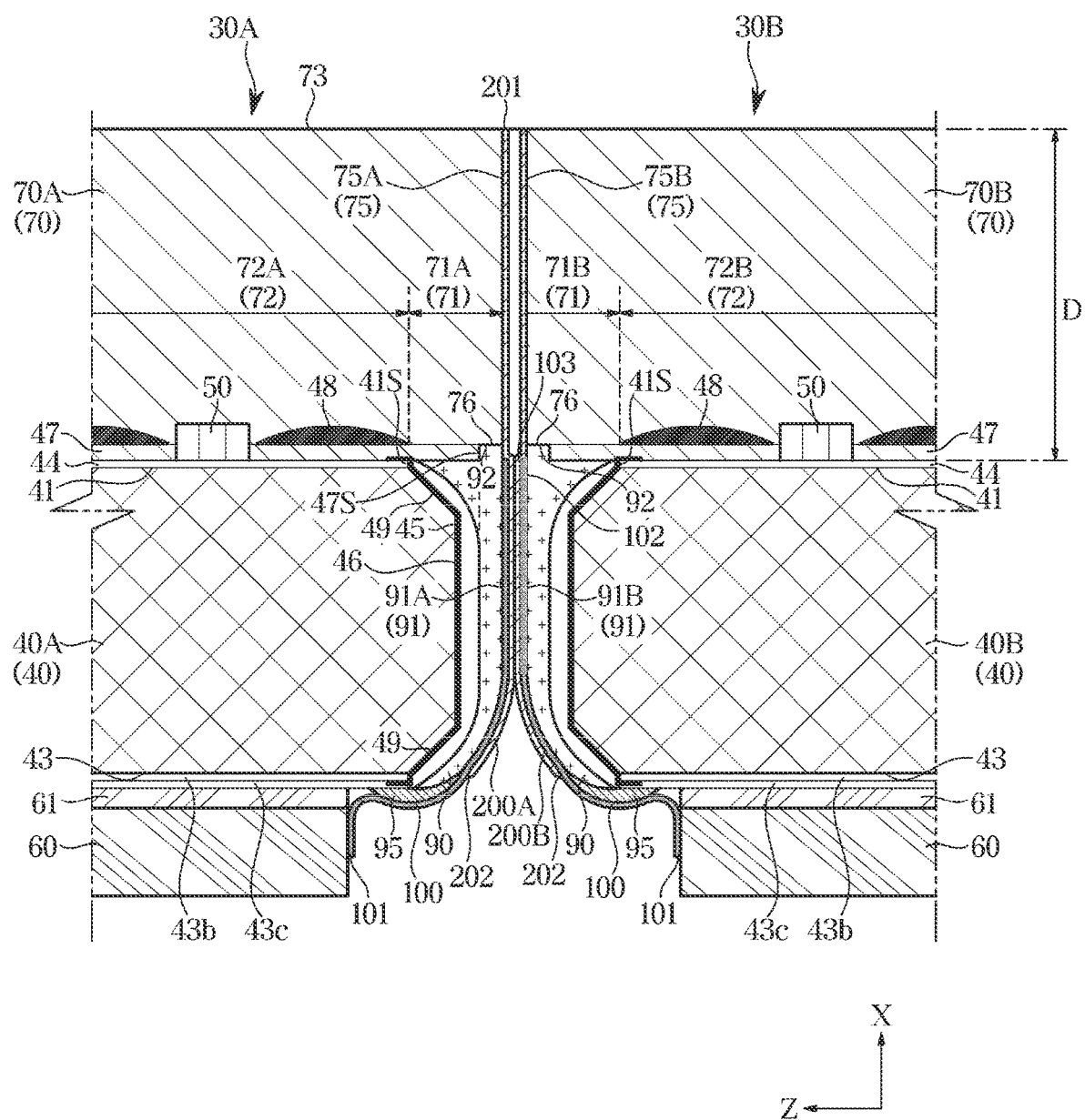
FIG. 9 is an enlarged cross-sectional view illustrating a part of the configuration shown in FIG. 8.
Figure 10:
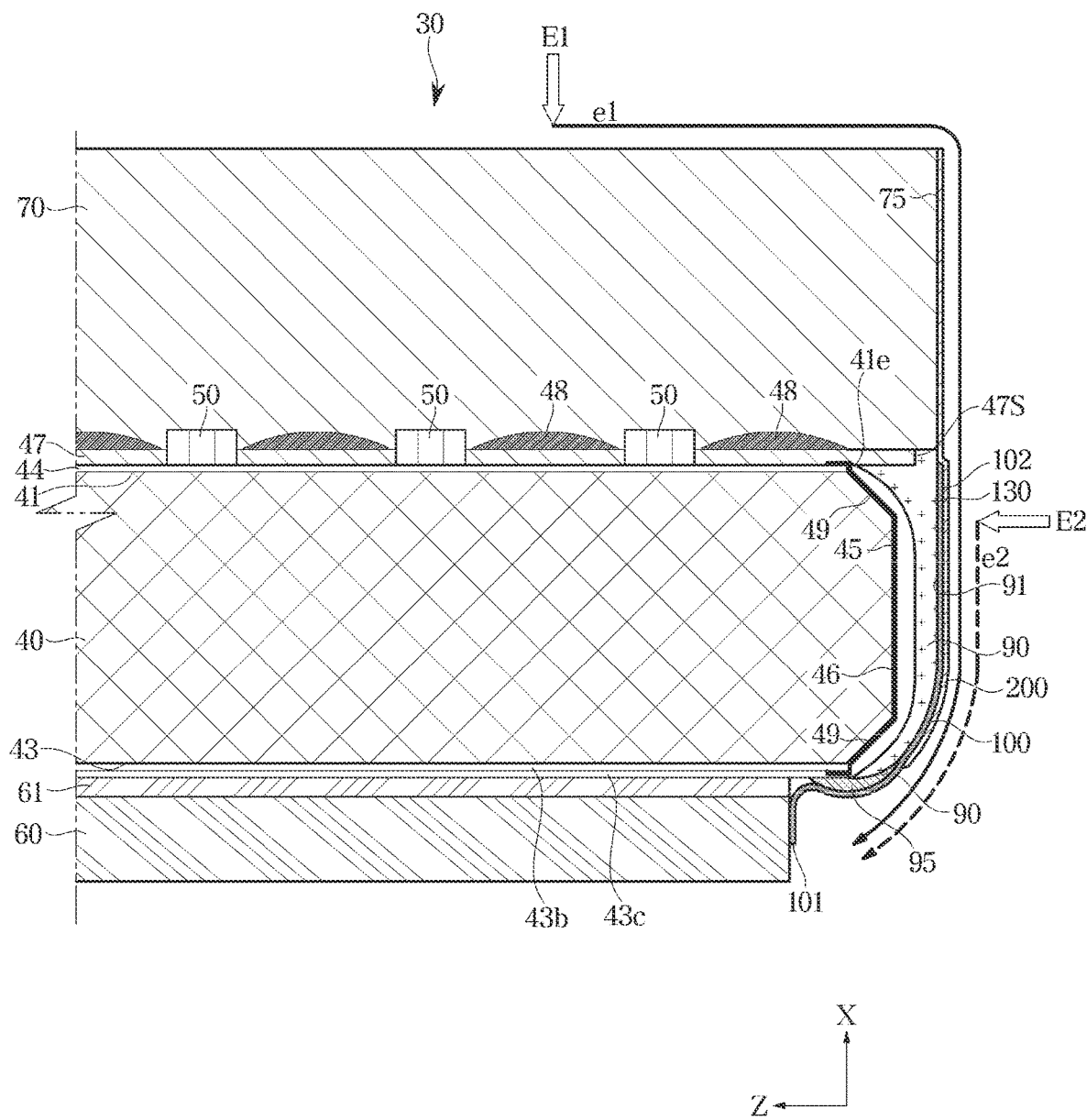
FIG. 10 is a view schematically illustrating an Electrostatic Discharge (ESD) flow of a part of the configuration of the display apparatus shown in FIG. 1.

FIG. 6 is a cross-sectional view illustrating a part of the configuration of the display apparatus shown in FIG. 1 with respect to a second direction, FIG. 7 is an enlarged cross-sectional view illustrating a part of the configuration shown in FIG. 6, FIG. 8 is a cross-sectional view illustrating a part of the configuration of the display apparatus shown in FIG. 1 with respect to a third direction, FIG. 9 is an enlarged cross-sectional view illustrating a part of the configuration shown in FIG. 8, and FIG. 10 is a view schematically illustrating an Electrostatic Discharge (ESD) flow of a part of the configuration of the display apparatus shown in FIG. 1.

The front cover 70 may protect the substrate 40 from the external force, and may reduce the visibility of the seam formed by a gap G formed between the plurality of display modules 30A-30P, and may reduce color deviation between the plurality of display modules 30A-30P.

The plurality of display modules 30A-30P may include the side cover 90 arranged in the gap G formed between the plurality of display modules 30A-30P in response to the array of the plurality of display modules 30A-30P.

The front cover 70 may be extended to the outside of the substrate 40 of the plurality of display modules 30A-30P so as to adsorb light reflected from the gap G between the plurality of display modules 30A-30P. A side end 75 of the front cover 70 may extend to a region on the outside of the mounting surface 41.

Particularly, the front cover 70 may be provided to extend to further outwards than an edge (or side end) 41S of the mounting surface 41 of the substrate 40 in the second direction Y and the third direction Z (refer to FIG. 5).

Substantially, the gap between the respective display modules 30A-30P may be generated between the side surface 45 of the substrate 40 of the respective display modules 30A-30P. However, according to an embodiment of the disclosure, the gap may mean a non-display region generated between the respective display modules 30A-30P, and it may be understood that the gap G formed between the plurality of display modules 30A-30P means separation from the edge 41S of the mounting surface 41 of the substrate 40 of the respective display modules 30A-30P to the edge 41S of the mounting surface 41 of the substrate 40 of the respective display modules 30A-30P that is adjacent thereto.

Therefore, the gap G formed between the plurality of display modules 30A-30P may mean separation from the edge 41S of the mounting surface 41 of the substrate 40 of the respective display modules 30A-30P to the edge 41S of the mounting surface 41 of the substrate 40 of the respective display modules 30A-30P that is adjacent thereto, in the second direction Y or the third direction Z.

The front cover 70 extending from each of the display modules 30A-30P may be arranged in the gap G between the plurality of display modules 30A-30P, and thus the front cover 70 may absorb light emitted to the gap G or light reflected from the gap G, thereby minimizing the recognition of the seam.

In addition, as will be described later, the light emitted to the gap G may be absorbed by the side cover 90 of the plurality of display modules 30A-30P arranged between the gap G, thereby minimizing the recognition of the seam.

As illustrated in FIGS. 6 and 7, the front cover 70 may be provided to extend to the outside of the substrate 40 in the second direction Y. Particularly, the front cover 70 may be provided to extend farther outwards than the side surface 45 and the chamfer 49 in the second direction Y.

According to an embodiment of the disclosure, only one edge side of the substrate 40 corresponding to the right edge 31 of the first display module 30A has been described, but the front cover 70 may extend farther outward in the second direction Y or the third direction Z than the four edges E of the substrate 40.

That is, the side end 75 of the front cover 70 corresponding to the edge of the front cover 70 may extend to the outside of the substrate 40, which is an outer region of the mounting surface 41, farther than the four edges E of the substrate 40 in the second direction Y or the third direction Z.

Although not shown in the drawings, the front cover 70 may include a plurality of layers each having different optical properties. Each of the plurality of layers may be provided in a structure laminated in the first direction X.

The plurality of layers may be bonded in the first direction X to form the front cover 70.

Among the plurality of layers, one layer may be provided as an anti-glare layer. However, embodiments of the disclosure are not limited thereto and may be provided as an anti-reflective layer or a layer in which an anti-glare layer and an anti-reflective layer are mixed.

Among the plurality of layers, another layer may be provided as a light transmittance control layer. However, embodiments of the disclosure are not limited thereto and another layer may be formed of a layer including different physical properties or materials or having different functions. For example, another layer may be provided as a circular polarization layer.

In addition, embodiments of the disclosure are not limited thereto and the plurality of layers may be provided as a single layer. A single layer may be provided as a layer configured to functionally implement all the functions of the plurality of layers.

According to embodiments of the disclosure, the front cover 70 may include an adhesive layer. The adhesive layer may be arranged at the rearmost side of the plurality of layers in the first direction X and bonded to the mounting surface 41. The adhesive layer may be provided to have a predetermined height or more in the first direction X to which the mounting surface 41 or the light emitting surface 54 faces.

This is to sufficiently fill a gap that may be formed between the adhesive layer and the plurality of inorganic light emitting devices 50 in response to bonding the adhesive layer to the substrate 40.

Embodiments of the disclosure are not limited thereto, and an adhesive layer may be provided as a component, which is separated from the front cover 70 and arranged between the front cover 70 and the mounting surface 41, thereby bonding the front cover 70 to the mounting surface 41.

Accordingly, the front cover 70 may be closely bonded to the mounting surface 41 so as to protect components mounted on the mounting surface 41 and thus the display module 30 may directly bond the front cover 70 to the substrate 40 without an additional molding structure between the front cover 70 and the substrate 40.

The front cover 70 may be provided to diffusely reflect light incident from the outside so as to prevent glare of the user that is caused by specular reflection of light incident from the outside.

The front cover 70 may diffusely reflect light incident from the outside and thus it is possible to reduce the glare and improve the contrast of the screen displayed on the display panel 20.

Further, the front cover 70 may be provided to reduce transmittance of incident external light or external light reflected from the substrate 40 and the gap G.

The front cover 70 according to an embodiment of the disclosure may include a material that reduces the transmittance of light, and absorb at least a portion of light transmitted toward the substrate 40 or at least a portion of light reflected from the substrate 40 in the first direction X.

Upon manufacturing the plurality of substrates, colors of some of the substrates may be different due to a difficulty in the production process. Accordingly, substrates having different unique colors may be tiled to form a single display panel.

As described above, the front cover 70 according to an embodiment of the disclosure absorbs at least a portion of the light that is reflected from the substrate 40 and transmitted to the outside, thereby increasing the integrity of the screen of the display panel 20.

That is, the front cover 70 may reduce the color deviation of each of the display modules 30A-30P, which is generated in the production process of the plurality of display modules 30A-30P, by lowering the external light transmittance.

The front cover 70 may prevent external light, which is incident from the outside to the display panel 20, from being transmitted to the substrate 40, and additionally absorb a portion of light incident on the display panel 20 from the outside or a portion of light that is reflected from the substrate 40 and transmitted to the outside of the display panel 20. Therefore, the front cover 70 may improve the contrast of the screen displayed on the display panel 20. The different optical actions may be respectively implemented using the above-described plurality of layers.

That is, the front cover 70 may be arranged in front of the substrate 40 with respect to the first direction X to improve the contrast that may be reduced by external light in the screen displayed on the display panel 20.

As described above, in the display module 30 according to an embodiment of the disclosure, the front cover 70 may be provided to extend to the outside of the substrate 40 in the second direction Y.

Accordingly, a portion of the light introduced into the gap G formed between the plurality of display modules 30A-30P may be blocked by at least a portion of the front cover 70 arranged in the gap G, and at least a portion of external light introduced into the gap G or external light reflected from the gap G may be absorbed by the front cover 70, and thus the light may be not transmitted to the outside. Therefore, it is possible to reduce the visibility of the seam formed in the gap G, and thus it is possible to increase the integrity of the screen displayed on the display panel 20 due to the reduction of the visibility of the seam.

Particularly, the side end 75 of the front cover 70 in the second direction Y may be arranged outside the edge 41S of the mounting surface 41 or in the gap G in the second direction Y.

Accordingly, the front cover 70 may include a first region 71 arranged on outwards from the edge 41S of the mounting surface 41 or in the gap G in the second direction Y, and a second region 72 arranged on the mounting surface 41 in the second direction Y.

The first region 71 and the second region 72 of the front cover 70 may be partitioned in the second direction Y by the gap G.

The first region 71 of the front cover 70 may be arranged in the gap G and thus external light emitted to the gap G may be blocked by the first region 71 of the front cover 70 and light reflected from the gap G may be prevented from being emitted to the outside. Therefore, it is possible to reduce the visibility of the seam, which is a boundary between the plurality of display modules 30A-30P and generated by the gap G, and thus it is possible to improve the integrity of the display panel 20.

The front cover 70 may be provided to extend farther outwards than the four of the edge 41S of the mounting surface 41 of the substrate 40 as described above, and thus the visibility of the seam, which is formed at each edge of the plurality of display modules 30A-30P, may be reduced.

When the first display module 30A and the second display module 30E are described as an example, a first region 71A of the first front cover 70A extending from the first display module 30A may be arranged in the gap G formed between the first display module 30A and the second display module 30E.

Side ends 75A and 75E, which are adjacent to each other, of the first front cover 70A and the second front cover 70E of the first display module 30A and the second display module 30E may be arranged in the gap G.

In addition, the side surface 45 and the chamfer 49 of the first display module 30A and the second display module 30E may be arranged in the gap G.

The second region 72A of the first front cover 70A may be arranged on the mounting surface 41 of the first display module 30A.

The first region 71E of the second front cover 70E of the second display module 30E may be arranged in the gap G formed between the first display module 30A and the second display module 30E. The second region 72E of the second front cover 70E may be arranged on the mounting surface 41 of the second display module 30E.

That is, in the gap G formed between the first display module 30A and the second display module 30E, the first region 71A of the first front cover 70A and the first region 71E of the second front cover 70E may be arranged side by side in the second direction Y.

A length in which the first region 71A of the first front cover 70A and the first region 71E of the second front cover 70E extend in the second direction Y may be approximately less than or equal to half of the gap G.

Accordingly, in response to the first region 71A of the first front cover 70A and the first region 71E of the second front cover 70E being arranged side by side in the second direction Y, the sum of the lengths of the first regions 71A and 71E may be provided to be approximately less than or equal to the length of the gap G.

According to an embodiment of the disclosure, in response to the first region 71A of the first front cover 70A and the first region 71E of the second front cover 70E being arranged side by side in the second direction Y, a predetermined separation may be formed between the side end 75A of the first front cover 70A and the side end 75E of the second front cover 70E.

However, the separation may be a relatively small value and thus may be negligible. Therefore, the first display module 30A and the second display module 30E may be tiled substantially without large separation between the first region 71A of the first front cover 70A and the first region 71E of the second front cover 70E.

As described above, in the gap G between the first display module 30A and the second display module 30E, the first region 71A of the first front cover 70A and the first region 71E of the second front cover 70E may be arranged.

External light incident on the display panel 20 may be diffusely reflected to the outside of the display panel 20 or partially absorbed by the first regions 71A and 71E while passing through the first region 71A of the first front cover 70A and the first region 71E of the second front cover 70E. Accordingly, an amount of light reaching the gap G may be reduced, and the visibility of the boundary between the first display module 30A and the second display module 30E due to the gap G may be reduced.

In addition, the light reflected from the gap G and directed to the outside of the display panel 20 may be diffusely reflected to the outside of the display panel 20 or partially absorbed by the first regions 71A and 71E while passing through the first region 71A of the first front cover 70A and the first region 71E of the second front cover 70E. Accordingly, an amount of light that is transmitted to the outside of the display panel 20 may be reduced, and the visibility of the boundary between the first display module 30A and the second display module 30E due to the gap G may be reduced.

That is, it is possible to absorb at least a portion of external light reflected from the gap G while reducing the amount of light introduced into the gap P formed between the plurality of display modules 30A-30P. Accordingly, it is possible to improve the integrity of the screen of the display panel 20.

Additionally, even if the substrate 40A of the first display module 30A and the substrate 40E of the second display module 30E have different colors, at least a portion of the light, which is reflected when each of the substrate 40A and the substrate 40E is displayed to the outside by the reflection of the external light, may be absorbed by the first front cover 70A and the second front cover 70E and thus the unique color of each of the substrate 40A and the substrate 40E may be not recognized to the outside. Therefore, it is possible to improve the integrity of the screen of the display panel 20.

The first display module 30A may include the side cover 90 arranged under the front cover 70 in a direction, to which the mounting surface 41 faces, and provided on the side surface 45 of the substrate 40.

Particularly, the side cover 90 may be arranged in a space formed on a lower surface 76 of the first region 71 of the front cover 70 in the first direction X and the side surface of the substrate 40 in the second direction Y.

The side cover 90 may be bonded to the lower surface 76 of the first region 71, the side surface 45, and at least a portion of the metal plate 60. It is appropriate that the side cover 90 is provided to be bonded to the entire lower surface 76 of the first region 71. Further, it is appropriate that the side cover 90 is provided to cover the entire region of the side surface 45.

The lower surface 76 of the first region 71 may correspond to the entire lower surface of the front cover 70 and represent a rear surface of an adhesive layer (not shown) formed at the rearmost end of the front cover 70.

In addition, the side cover 90 may be provided to cover all of a pair of the chamfer 49 arranged in the front and rear direction of the side surface 45 in the first direction X.

The side cover 90 may be provided to surround the entire chamfer 49 formed between the mounting surface 41 and the side surface 45, as well as the side surface 45.

The side cover 90 is provided to surround the chamfer 49 formed between the mounting surface 41 and the side surface 45 and thus the side cover 90 may fill an entire space formed between the substrate 40 and the front cover 70.

Accordingly, the side cover 90 may prevent foreign substances or moisture from entering the space between the substrate 40 and the front cover 70 from the outside.

In addition, because the side cover 90 is provided to surround the chamfer 49 formed between the rear surface 43 and the side surface 45, the side cover 90 may fill a space formed between the substrate 40 and the metal plate 60.

Accordingly, the side cover 90 may prevent foreign substances or moisture from entering the space between the substrate 40 and the metal plate 60 from the outside.

The side cover 90 may be provided to be in contact with the lower surface 76 of the first region 71 and the chamfer 49 and the side surface 45 of the substrate 40. Accordingly, the side cover 90 may support the lower surface 76 of the first region 71 and the chamfer 49 and the side surface 45 of the substrate 40.

According to embodiments of the disclosure, the front cover 70 and the substrate 40 are bonded to each other by the front cover 70, and the adhesiveness of the front cover 70 and the substrate 40 may be increased by the side cover 90. Accordingly, the side cover 90 may prevent the front cover 70 from being separated from the substrate 40.

That is, the reliability of the first display module 30A may be increased by the side cover 90.

In addition, the substrate 40 and the metal plate 60 are bonded to each other by the rear adhesive tape 61, and the adhesiveness between the metal plate 60 and the substrate 40 may be increased by the side cover 90. Accordingly, the side cover 90 may prevent the metal plate 60 from being separated from the substrate 40.

As described above, the side surface 45 of the substrate 40 may be provided to correspond to the four of the edge 41S of the mounting surface 41, and the first region 71 of the front cover 70 may extend farther outwards than the four of the edge 41S of the mounting surface 41 in the second direction Y and in the third direction Z in which the mounting surface 41 is extended.

The side cover 90 may be provided to surround the lower surface 76 of the first region 71 and the side surface 45 corresponding to the four of the edge 41S of the mounting surface 41 along the circumference of the four of the edge 41S of the mounting surface 41.

That is, the side cover 90 may be provided to seal the entire edge of the portion where the substrate 40 and the front cover 70 are bonded to each other.

The side cover 90 may cover the lower surface 76 of the first region 71 and the side surface 45 in all directions perpendicular to the first direction X.

Accordingly, the coupling between the front cover 70 and the substrate 40 may be improved, and the side cover 90 may protect the front cover 70 and the side surface 45 of the substrate 40 from external forces.

In addition, as described above, the side cover 90 may prevent external moisture or foreign substances from entering between the substrate 40 and the front cover 70. Additionally, even when a gap is formed between the substrate 40 and the front cover 70 due to an adhesive difficulty, the side cover 90 may prevent external moisture or foreign substances from entering the gap.

The side cover 90 may be provided to surround all four edges E of the substrate 40 along the side surface 45 of the substrate 40 and thus it is possible to seal among the substrate 40 and the front cover 70 and the metal plate 60.

Accordingly, the side cover 90 may prevent foreign substances or moisture from entering between the substrate 40 and the front cover 70 even when foreign substances or moisture enter the substrate 40 in any direction.

As described above, because the rearmost end of the front cover 70 in the first direction X is provided as an adhesive layer, the lower surface 76 of the first region 71 may be provided as a rear surface of the adhesive layer.

Accordingly, in a comparative embodiment, in response to the lower surface 76 of the first region 71 being exposed to the outside, foreign substances flowing from the outside may adhere to the lower surface 76 of the first region 71.

In response to the array of the plurality of display modules 30A-30P, in the comparative embodiment, in a state in which the foreign substances adhere to the lower surface 76 of the first region 71, the recognition of the seam between the plurality of display modules 30A-30P may be increased by the foreign substances adhering to the lower surface 76 of the first region 71.

However, the first display module 30A according to an embodiment of the disclosure includes the side cover 90, and the side cover 90 is provided to cover the lower surface 76 of the first region 71. It is possible to prevent the foreign substances from adhering to the lower surface 76 of the first region 71.

Accordingly, it is possible to reduce the recognition of the seam generated between the plurality of display modules 30A-30P.

As will be described later, due to the electrostatic discharge that may occur on the display modules 30A-30P in a comparative embodiment, the current may flow into the plurality of electronic components mounted on the substrate 40 and thus the electronic components may be damaged in the comparative embodiment. However, the side cover 90 may seal the substrate 40 from the outside to prevent damage to the electronic components, thereby preventing the electric charges generated by the electrostatic discharge from flowing into the substrate 40.

That is, the substrate 40 is sealed by the front cover 70 and the side cover 90 and thus the electric charges generated by the electrostatic discharge do not pass through the front cover 70 and the side cover 90. Accordingly, it is possible to prevent the electric charges from passing through the substrate 40 and to guide the electric charges, which flows on the front cover 70 and the side cover 90, to the metal plate 60 in contact with the side cover 90, thereby providing a path of the current generated by the electrostatic discharge. Accordingly, the ESD withstand voltage of the electronic components mounted on the substrate 40 may be improved.

As described above, the first display module 30A may be provided to be arranged under the front cover 70 in a direction to which the mounting surface 41 faces. That is, the side cover 90 is not arranged above the lower surface 76 in the first direction X.

A front-most surface 92 of the side cover 90 in the first direction X may be provided in contact with the lower surface 76 of the first region 71, and may not be arranged in front of the lower surface 76 of the first region 71 in the first direction X.

This is to prevent the side cover 90 from arranging on a movement path of the light emitted from the plurality of inorganic light emitting devices 50.

Based on at least a portion of the side cover 90 being arranged in front of the lower surface 76 or in front of the front cover 70 in the first direction X in a comparative embodiment, the at least a portion of the side cover 90 may be arranged on the path of light moving forward through the front cover 70.

That is, in the comparative embodiment, the side cover 90 may absorb or diffusely reflect a portion of light and thus a portion of image displayed on the display panel 20 may be distorted.

However, the side cover 90 according to an embodiment of the disclosure is arranged behind the front cover 70 in the first direction X, and thus the side cover 90 may not restrict the movement of light emitted by the plurality of inorganic light emitting devices 50. Therefore, the image quality of the display panel 20 may be improved.

The side end 75 of the front cover 70 in the second direction Y and a side end 91 of the side cover 90 in the second direction Y may be arranged on substantially the same line in the first direction X.

This is because the front cover 70 and the side cover 90 are simultaneously cut in the manufacturing process of the first display module 30A. In addition, a ground member 100 (refer to FIG. 9) may be bonded to the side end 75 of the front cover 70 and the side end 91 of the side cover 90 that are arranged on the substantially same line in the first direction X.

That is, separation formed between the plurality of display modules 30A-30P in response to the array of the plurality of display modules 30A-30P may be minimized, and the seam recognized through the separation between the plurality of display modules 30A-30P may be minimized.

The side cover 90 may include a material that absorbs light. For example, the side cover 90 may be formed of an opaque or translucent material.

Further, the side cover 90 may include a photosensitive material. For example, the side cover 90 may be formed of a photosensitive optical clear resin (OCR). In response to the external light having a wavelength other than that of visible light such as ultraviolet (UV) light, physical properties of the photosensitive material may be changed, and the color of the photosensitive material may be changed to a dark color.

Accordingly, the side cover 90 may be provided as a material that is colored to a dark color in response to the emission of the UV light to the side cover 90 during the manufacturing process, so as to absorb light.

The side cover 90 may have a dark color. The side cover 90 may have a darker color than a color of the front cover 70.

It is appropriate that the side cover 90 has a color similar to that of the black matrix 48.

Accordingly, light incident on the side cover 90 may be absorbed by the material, which absorbs the light, of the side cover 90 without being reflected.

In response to the array of the plurality of display modules 30A-30P, the side cover 90 may be arranged in the gap G formed between the plurality of display modules 30A-30P together with the first region 71 of the front cover 70.

Accordingly, it is possible to absorb the light introduced into the gap G so as to minimize light that is introduced into the gap G and reflected toward the outside. Accordingly, it is possible to reduce the visibility of the seam formed by the gap G formed between the plurality of display modules 30A-30P.

When the first display module 30A and the second display module 30E are described as an example, a first side cover 90A of the first display module 30A and a second side cover 90E of the second display module 30E may be arranged in the gap G formed between the first display module 30A and the second display module 30E together with the first region 71A of the first front cover 70A and the first region 71E of the second front cover 70E.

The adjacent side ends 75A and 75E of the first front cover 70A and the second front cover 70E and the adjacent side ends 91A and 91E of the first side cover 90A and the second side cover 90E of the first display module 30A and the second display module 30E may be arranged in the gap G.

The adjacent side ends 75A and 75E of the first front cover 70A and the second front cover 70E and the adjacent side ends 91A and 91E of the first side cover 90A and the second side cover 90E may be arranged to face each other. It is appropriate that the adjacent side ends 75A and 75E of the first front cover 70A and the second front cover 70E and the adjacent side ends 91A and 91E of the first side cover 90A and the second side cover 90E may be arranged in parallel to each other.

As described later, on the side ends 91A and 91E of the first side cover 90A and the second side cover 90E, respective ones of the ground member 100 and light absorbing end members 200A and 200E of the first display module 30A and the second display module 30E may be arranged.

In the gap G formed between the first display module 30A and the second display module 30E, the first regions 71A and 71E of the first front cover 70A and the second front cover 70E and the first side cover 90A and the second side cover 90E may be arranged side by side in the second direction Y.

A length of the first side cover 90A and the second side cover 90E extending in the second direction Y may be provided in approximately less than or equal to half of the gap G in accordance with the first regions 71A and 71E of the first front cover 70A and the second front cover 70E.

In the gap G formed between the first display module 30A and the second display module 30E, the first region 71A of the first front cover 70A and the first region 71E of the second front cover 70E may be arranged, and the first side cover 90A and the second side cover 90E may be arranged behind each of the first regions 71A and 71E in the first direction X.

As described above, the external light incident on the display panel 20 is diffusely reflected to the outside of the display panel 20 or partially absorbed while passing through the first regions 71A and 71E of the first front cover 70A and the second front cover 70E. Accordingly, the amount of light reaching to the gap G may be reduced.

Further, even if a portion of light reaches the gap G, the light introduced into the gap G is absorbed by the first side cover 90A and the second side cover 90E, which are arranged in the gap G, and thus the visibility of the boundary between the first display module 30A and the second display module 30E may be reduced.

That is, it is possible to additionally absorb the light reaching the gap G while reducing the amount of external light introduced into the gap G formed between the plurality of display modules 30A-30P. Accordingly, it is possible to improve the integrity of the screen of the display panel 20.

Light, which is not absorbed by the first side cover 90A and the second side cover 90E and is reflected on the first side cover 90A and the second side cover 90E and directed to the outside of the display panel 20, may be diffusely reflected to the outside of the display panel 20 or partially absorbed in the first regions 71A and 71E while passing through the first front cover 70A and the second front cover 70E. Accordingly, an amount of light transmitted to the outside of the display panel 20 may be reduced and the visibility of the boundary between the first display module 30A and the second display module 30E due to the gap G may be reduced.

As described above, the side cover 90 may be arranged in the gap G formed between the plurality of display modules 30A-30P in response to the array of the plurality of display modules 30A-30P, and thus the side cover 90 may absorb light reaching the gap G, thereby reducing the recognition of the seam caused by the gap G.

In the above-described example, the front cover 70 is provided to reduce the amount of light reaching the substrate 40 by diffusely reflecting, absorbing, circularly polarizing, or changing the reflection direction of a portion of the light introduced into the display panel 20.

However, embodiments of the disclosure are not limited thereto, and the front cover 70 may be formed of a transparent material through which light is transmitted without deformation. Even in this case, the visibility of the boundary between the plurality of display modules 30A-30P due to the gap G may be reduced by the side cover 90 arranged between the plurality of display modules 30A-30P.

As described above, the side cover 90 may be formed of a material that absorbs light, and based on at least a portion of the side cover 90 being arranged in front of the front cover 70 in the first direction X in a comparative embodiment, a portion of the light emitted from the plurality of inorganic light emitting devices 50 may be absorbed. Accordingly, in the comparative embodiment, a difficulty in that a part of the screen displayed on the display panel 20 is darkly displayed may occur.

However, the side cover 90 according to an embodiment of the disclosure is arranged under the front cover 70 in the first direction X, particularly, under the lower surface 76 of the first region 71. Accordingly, the side cover 90 may not absorb light emitted from the plurality of inorganic light emitting devices 50, and thus the brightness of the image displayed on the display panel 20 may be uniform.

As illustrated in FIGS. 8 and 9, the front cover 70 may be provided to extend to the outside of the substrate 40 in the third direction Z. Particularly, the front cover 70 may be provided to extend farther outward than the side surface 45 and the chamfer 49 in the third direction Z.

The side end 75 of the front cover 70 in the third direction Z may be arranged outside the edge 41S of the mounting surface 41 or in the gap G in the third direction Z.

The first region 71 and the second region 72 of the front cover 70 described above may be partitioned in the third direction Z by the gap G.

When the first display module 30A and the third display module 30B are descried as an example, the first region 71A of the first front cover 70A extending from the first display module 30A may be arranged in the gap G formed between the first display module 30A and the third display module 30B.

The adjacent side ends 75A and 75B of the first front cover 70A and the third front cover 70B of the first display module 30A and the third display module 30B may be arranged in the gap G.

Further, the side surface 45 and the chamfer 49 of the first display module 30A and the third display module 30B may be arranged in the gap G.

A first region 71B of the third front cover 70B extending from the third display module 30B may be arranged in the gap G formed between the first display module 30A and the third display module 30B. A second region 72B of the third front cover 70B may be arranged on the mounting surface 41 of the third display module 30B.

That is, in the gap G formed between the first display module 30A and the third display module 30B, the first regions 71A and 71B of the first front cover 70A and the third front cover 70B may be arranged side by side in the third direction Z.

External light incident into the display panel 20 may be diffusely reflected to the outside of the display panel 20 or partially absorbed by the first regions 71A and 71B while passing through the first regions 71A and 71B of the first front cover 70A and the third front cover 70B. Accordingly, an amount of light reaching the gap G may be reduced and thus the visibility of the boundary between the first display module 30A and the third display module 30B due to the gap G may be reduced.

Light, which is reflected on the gap G and directed to the outside of the display panel 20, may be diffusely reflected to the outside of the display panel 20 or partially absorbed by the first regions 71A and 71B while passing through the first regions 71A and 71B of the first front cover 70A and the third front cover 70B. Accordingly, an amount of light transmitted to the outside of the display panel 20 may be reduced and thus the visibility of the boundary between the first display module 30A and the third display module 30B by the gap G may be reduced.

As described above, the side cover 90 may be arranged in a space formed on the side surface of the substrate 40 in the third direction Z as well as the second direction Y.

The side wiring 46 may be arranged on the side surface 45 of the substrate 40 arranged in the third direction Z. Accordingly, the side cover 90 provided on the side surface 45 arranged toward the third direction Z may be provided to cover not only the side surface 45 and the chamfer 49, but also the side wiring 46. Therefore, the side cover 90 may protect the side wiring 46 from external force and prevent foreign substances or moisture from entering the side wiring 46.

That is, the side cover 90 may surround the lower surface 76 of the first region 71 and the side surface 45 corresponding to the four of the edge 41S of the mounting surface 41 along the circumference of the four of the edge 41S of the mounting surface 41. Accordingly, the side cover 90 may surround the side wiring 46 extending along the side surface 45 in the third direction Z.

Accordingly, the coupling between the front cover 70 and the substrate 40 may be improved, and the side cover 90 may protect the front cover 70, the side surface 45 and the side wiring 46 of the substrate 40 from external forces.

The side end 75 of the front cover 70 in the third direction Z and the side end 91 of the side cover 90 in the third direction Z may be arranged on the same line in the first direction X. It is appropriate that the side end 75 of the front cover 70 and the side end 91 of the side cover 90 may be arranged on the same line in a direction parallel to the first direction X.

When the first display module 30A and the third display module 30B are descried as an example, the first side cover 90A of the first display module 30A and the third side cover 90B of the third display module 30B may be arranged in the gap G formed between the first display module 30A and the third display module 30B together with the first region 71A of the first front cover 70A and the first region 71B of the third front cover 70B.

The adjacent side ends 75A and 75B of the first front cover 70A and the third front cover 70B and the adjacent side ends 91A and 91B of the first side cover 90A and the third side cover 90B of the first display module 30A and the third display module 30B may be arranged in the gap G.

The adjacent side ends 75A and 75B of the first front cover 70A and the third front cover 70B and the adjacent side ends 91A and 91B of the first side cover 90A and the third side cover 90B may be arranged to face each other.

It is appropriate that the adjacent side ends 75A and 75B of the first front cover 70A and the third front cover 70B and the adjacent side ends 91A and 91B of the first side cover 90A and the third side cover 90B may be arranged in parallel to each other.

That is, in the gap G formed between the first display module 30A and the third display module 30B, the first regions 71A and 71B of the first front cover 70A and the third front cover 70B and the first side cover 90A and the third side cover 90B may be arranged side by side in the third direction Z.

The side end 75 of the front cover 70 and the side end 91 of the side cover 90 in the third direction Z may be formed on the same line in the first direction X. The ground member 100 may be bonded to the side end 75 of the front cover 70 and the side end 91 of the side cover 90 in the third direction Z, and thus it is possible to minimize separation formed between the first display module 30A and the third display module 30B in response to the array of the first display module 30A and the third display module 30B.

In the gap G formed between the first display module 30A and the third display module 30B, the first regions 71A and 71B of the first front cover 70A and the third front cover 70B and the first side cover 90A and the third side cover 90B may be arranged side by side in the third direction Z.

In the gap G formed between the first display module 30A and the third display module 30B, the first region 71A of the first front cover 70A and the first region 71B of the third front cover 70B may be arranged, and the first side cover 90A and the third side cover 90B may be arranged behind each of the first regions 71A and 71B in the first direction X.

As described above, external light incident on the display panel 20 may be diffusely reflected to the outside of the display panel 20 or partially absorbed while passing through the first regions 71A and 71B of the first front cover 70A and the third front cover 70B. Accordingly, an amount of light that reaching the gap G may be reduced.

In addition, even when a portion of the light reaches the gap G, the light may be absorbed to the first side cover 90A and the third side cover 90B formed in the gap G, and thus the visibility of the boundary between the first display module 30A and the third display module 30B may be reduced.

Light, which is not absorbed by the first side cover 90A and the third side cover 90B and is reflected on the first side cover 90A and the third side cover 90B and directed to the outside of the display panel 20, may be diffusely reflected to the outside of the display panel 20 or partially absorbed in the first regions 71A and 71B while passing through the first regions 71A and 71B of the first front cover 70A and the third front cover 70B. Accordingly, an amount of light transmitted to the outside of the display panel 20 may be reduced and thus the visibility of the boundary between the first display module 30A and the third display module 30B due to the gap G may be reduced.

A predetermined dose of the side cover 90 may be applied by a dispenser in the manufacturing process. The applied side cover 90 may be cured through subsequent operations. The side cover 90 may be formed of non-conductive black resin.

The side cover 90 may be applied to cover the rear surface of the front cover 70 and the side surface 45 of the substrate 40, and an entirety of the chamfer 49 formed between the side surface 45 of the substrate 40 and the mounting surface 41, and the chamfer 49 formed between the side surface 45 and the rear surface 43.

In addition, in the anisotropic conductive layer 47, a region arranged outside the mounting surface 41 and the side end 47S of the anisotropic conductive layer 47 may also be covered by the applied side cover 90.

The dispensing operation of the side cover 90 may be performed on all four edges E of the substrate 40. Accordingly, the side cover 90 may be dispensed to cover all of a plurality of the side surface 45 of the substrate 40. In addition, in the anisotropic conductive layer 47, the entire region arranged outside the mounting surface 41 may be covered by the side cover 90.

While the side cover 90 is cured, with respect to the first direction X, the side cover 90 may be bonded to the rear surface of the front cover 70 and the side surface 45 of the substrate 40, the chamfer 49 formed between the mounting surface 41 and the side surface 45, and the region, which is arranged outside the mounting surface 41, in the anisotropic conductive layer 47.

Based on the side cover 90 including a photosensitive material, the side cover 90 may be colored in a dark color by irradiating ultraviolet rays (UX) or the like as a subsequent operation. However, based on the side cover 90 being formed of a translucent or opaque material without including a photosensitive material, such a manufacturing process is unnecessary.

As described above, the side wiring 46 may be arranged on the side surface 45 of the substrate 40 in the third direction Z. Due to the side cover 90, the side wiring 46 may be prevented from being exposed to the outside.

Additionally, a sealing member 95 provided to seal the side wiring 46 may be formed to prevent the side wiring 46 from being exposed to the outside. Particularly, the sealing member 95 may be provided to seal a portion in which the side wiring 46 is connected to the rear wiring layer 43b.

As described above, the side cover 90 is provided to cover the side surface 45 of the substrate 40. However, the side cover 90 may not cover the portion, in which the side wiring 46 is connected to the rear wiring layer 43b, due to an error in the dispensing process of the side cover 90, and thus the sealing member 95 may prevent the portion of the side wiring 46 from being exposed to the outside.

Particularly, because the portion, in which the rear wiring layer 43b is connected to the side wiring 46, is located on the edge of the rear surface 43 of the substrate 40, the side cover 90 may not be applied to the portion upon dispensing the side cover 90.

Accordingly, the side wiring 46 may be protected from the outside by additionally dispensing the sealing member 95 on the edge of the rear surface 43 of the substrate 40.

However, based on the side cover 90 extending in the first direction X to cover the side surface of the display module 30 so as to cover at least a portion of the side surface 45 and the side surface of the metal plate 60, the process of dispensing the sealing member 95 may be excluded and the side cover 90 may be provided to cover the portion in which the side wiring 46 is connected to the rear wiring layer 43b.

That is, the side cover 90 may be provided to be dispensed so as to be applied not only to the side surface 45 but also to the edge of the rear surface 43, and in this case, the sealing member 95 may not be dispensed additionally.

As illustrated in FIGS. 7 and 9, the side cover 90 may be provided not only to cover the outside of the side surface 45 of the substrate 40 in the third direction Z, but also to cover the outside of the side surface 45 in the second direction Y.

That is, as described above, the side cover 90 may be provided to surround all four edges E of the substrate 40.

Accordingly, the mounting surface 41, which is the front surface of the substrate 40, may be covered by the front cover 70. The rear surface 43 of the substrate 40 may be covered by the metal plate 60 or the metal plate 60 and the sealing member 95. The side surface 45 and the chamfer 49 of the substrate 40 may be covered by the side cover 90.

Particularly, the side cover 90 is provided to extend from the upper portion of the metal plate 60 to the lower surface 76 of the front cover 70 in the first direction X, or the side cover 90 together with the sealing member 95 is provided to cover the entire side surface of the display module 30. Accordingly, the side cover 90 may completely seal the substrate 40 from the outside.

The front cover 70 may be formed of a non-conductive material through which electric charges do not penetrate.

The side cover 90 may be formed of a non-conductive material through which electric charges do not penetrate.

The sealing member 95 may be formed of a non-conductive material through which electric charges do not penetrate.

Because the front cover 70, the side cover 90, and the sealing member 95 are formed of a non-conductive material, most of the current applied to the front cover 70 or the side cover 90 may not pass through the cover 90 and may flow on the front cover 70 and the side cover 90.

In addition, the metal plate 60 may be formed of a material having a large capacitance to serve as a ground configuration. Accordingly, in response to a current being applied on the metal plate 60, the metal plate 60 may be maintained at a constant potential. Accordingly, the current flowing into the metal plate 60 may be absorbed by the metal plate 60, and it is possible to prevent a state in which the current flows to the substrate 40 through the metal plate 60.

That is, as for the display apparatus 1, all of the side wiring 46 of the substrate 40 is provided to be surrounded by the side cover 90 and the sealing member 95, and thus the side wiring 46 is not exposed to the outside. Even if static electricity is discharged from the side surface 45 of the substrate 40, the current may not flow into the side wiring 46 due to the side cover 90. The plurality of display modules may be tiled to form a display panel in a process in which the display panel is implemented with the display module. With respect to a comparative embodiment, on a path in which each display module is manufactured and transported in a process in which each display module forms a display panel, a current generated by the electrostatic discharge is introduced into the display module, thereby causing a damage in the electronic components mounted inside the display module in the comparative embodiment.

Particularly, in the comparative embodiment, the side wiring or the anisotropic conductive layer 47 extending along the side surface of the substrate may be exposed to the outside due to a defect in the manufacturing process of the display module 30. Separation may occur between the front cover 70 and the substrate 40 due to a poor contact, and separation may occur in the inside thereof in the process of applying and curing of the side cover 90. In this case, the current generated by the electrostatic discharge may be introduced through the anisotropic conductive layer 47, the side wiring 46 or the separation caused by the defect in the comparative embodiment. Accordingly, the electrical structure arranged on the substrate may be damaged in the comparative embodiment.

From a process before the display module 30 is coupled to the frame 15 to be assembled as the display apparatus 1, the display module 30 may include the front cover 70, the side cover 90, the sealing member 95, and the metal plate 60 to absorb an electric shock to prevent the electronic components mounted inside the display module from being damaged by the current caused by the electrostatic discharge.

Accordingly, each of the display modules 30A-30P may independently include a configuration provided to block the current generated by the electrostatic discharge from flowing into the configuration mounted on the substrate 40. Each of the display modules 30A-30P may be provided such that the current generated by the electrostatic discharge is not introduced into the components mounted on the substrate 40 but rather is easily guided to the metal plate 60, which is a ground configuration, along the front cover 70, the sealing member 95, and the side cover 90 that seal the substrate 40 on each of the display modules 30A-30P.

However, as described above, in comparative embodiments, there may be a difficulty in that the electronic components are damaged due to defects occurring in the manufacturing process of the display modules 30A-30P.

In order to prevent this, the display apparatus 1 according to an embodiment of the disclosure may additionally include the ground member 100 formed of a material having higher conductivity than conductivity of the sealing member 95, and arranged at the outer end of the side cover 90 in the second direction Y and the third direction Z of the display module 30.

The ground member 100 may be provided to easily guide static electricity to the metal plate 60 even if the sealing of the display modules 30A-30P is not perfect due to manufacturing defects.

Each of the display modules 30A-30P is the same, and thus hereinafter the first display module 30A will be described as a representative. The ground member 100 may be provided to cover both the outside of the side surface 45 of the substrate 40 in the second direction Y and the outside of the side surface 45 of the substrate 40 in the third direction Z.

That is, the ground member 100 may be provided to surround all four edges E of the substrate 40.

It is appropriate that the ground member 100 is formed of a metal material, and a material having higher conductivity than conductivity of the side cover 90. The ground member 100 may be coated on the side cover 90 to be arranged at an outer end of the side cover 90.

Accordingly, in the array of the display modules 30A-30P, the ground member 100 may be arranged in the gap G formed between the respective display modules 30A-30P.

The ground member 100 may include a first member 101 provided to be in contact with the metal plate 60, and a second member 102 connected to the first member 101 and arranged at the side end 91 of the side cover 90. The first member 101 may be provided to be grounded with the metal plate 60. The first member 101 of the ground member 100 may be provided to be in contact with a side surface of the metal plate 60 in the second direction Y or the third direction Z.

The second member 102 of the ground member 100 may be provided to be in contact with at least a portion of the side cover 90. An upper end 130 of the second member 102 in the first direction X may be spaced apart from an upper end of the front cover 70 in the first direction X by a predetermined distance D.

It is appropriate that the upper end 130 of the second member 102 in the first direction X is arranged behind the light emitting surface 54 of the plurality of inorganic light emitting devices 50 in the first direction X.

As described above, the ground member 100 may be arranged in the gap G. Accordingly, based on the upper end 130 of the second member 102 of the ground member 100 being higher than the light emitting surface 54 in the first direction X in a comparative embodiment, the seam that is formed between the display modules 30A-30P may be recognized by light emitted from the plurality of inorganic light emitting devices 50 in the comparative embodiment.

Therefore, in embodiments of the disclosure, the upper end of the front cover 70 and the upper end of the second member 102 are provided to be spaced apart by the predetermined distance D in the first direction X, and thus the recognition of the seam that is formed upon driving the display modules 30A-30P may be minimized.

The ground member 100 may be provided in a thin shape. This is because the ground member 100 is arranged between the gap G formed between the display modules 30A-30P in response to tiling the display modules 30A-30P. Based on the ground member 100 being thick in a comparative embodiment, the gap G formed between the display modules 30A-30P may be formed to be large due to the thickness of the ground member 100, and thus the seam between the display modules 30A-30P may be recognized in the comparative embodiment.

Therefore, in embodiments of the disclosure, the ground member 100 may be provided to have a small thickness. It is appropriate that the ground member 100 is provided to have a thickness of 10 μm or less.

The ground member 100 may be formed of a material having high conductivity. For example, the ground member 100 may be formed of a material, which is electrically grounded with the metal plate 60, such as a metal, a conductive polymer, and a conductive fabric.

The ground member 100 may be formed of a material having higher conductivity than the side cover 90. Further, the ground member 100 may be formed of a material having higher conductivity than the front cover 70.

Accordingly, as illustrated in FIG. 10, in response to a current e1 generated by an electrostatic discharge E1 on the front cover 70, the current e1 may not pass through the front cover 70 and thus may not be introduced into the substrate 40. Accordingly, the current e1 may flow on the front cover 70 and then be introduced into the ground member 100.

The current e1 introduced into the ground member 100 may flow to the metal plate 60 through the ground member 100. This is because the ground member 100 is provided to be in contact with the metal plate 60 to be grounded to the ground configuration.

The ground member 100 may provide a path for the current e1 caused by the electrostatic discharge E1 generated on the front cover 70 to flow to the metal plate 60 provided in the ground configuration.

In other words, the ground member 100 may guide electric charges generated by the electrostatic discharge E1 to flow to the ground.

In addition, in response to a current e2 generated by an electrostatic discharge E2 on the ground member 100 or the side cover 90, the current e2 may not pass through the side cover 90 and thus may not be introduced into the substrate 40. Accordingly, the current e2 may be introduced into the ground member 100 and flow on the metal plate 60.

At least a portion of the current e1 caused by the electrostatic discharge E1 may remain on the front cover 70 without flowing to the ground member 100, and the least a portion of the current e1 may be introduced into the substrate 40 by passing through the front cover 70. In addition, at least a portion of the current e2 caused by the electrostatic discharge E2 may remain on the side cover 90 without flowing to the ground member 100, and the least a portion of the current e2 may be introduced into the substrate 40 by passing through the side cover 90.

However, most of the current e1 caused by the electrostatic discharge E1 on the front cover 70 or the current e2 caused by the electrostatic discharge E2 on the side cover 90 may flow to the metal plate 60 through the ground member 100 having the high conductivity. Accordingly, even when a portion of the current e1 and e2 flows to the substrate 40, the ESD withstand voltage of the electronic components mounted on the substrate 40 may be improved.

In addition, as described above, in response to the current on the front cover 70 or the side cover 90 caused by the electrostatic discharge in the state in which the sealing of the front cover 70 and the side cover 90 is not perfect due to a defect in the manufacturing process of the first display module 30A-30P, the current may be induced to the high-conductivity ground member 100 and thus the ESD withstand voltage of the electronic components mounted on the substrate 40 may be improved.

Additionally, the electrostatic current transmitted to the metal plate 60 may be provided to exit to an external ground through a configuration in contact with the metal plate 60 such as a bridge board and a cable.

As described above, by the side cover 90 arranged between the gap G between the display modules 30A-30P, it is possible to minimize the recognition of the seam generated by the gap G. However, in a comparative embodiment, in response to the additional emission of the light generated from the plurality of inorganic light emitting devices 50, a portion of the light may be moved along the side surface of the front cover 70 and transmitted through the side end 75 of the front cover 70, thereby causing a light leakage on the side surface of the display modules 30A-30P in the comparative embodiment.

In response to the generation of the light leakage as the plurality of display modules 30A-30P is arrayed in the second direction Y and the third direction Z, a white seam caused by the light leakage may be recognized between the display modules 30A-30P in the comparative embodiment.

According to embodiments of the disclosure, in order to prevent a portion of the light emitted from the plurality of inorganic light emitting devices 50 from passing through the side end 75 of the front cover 70 so as to prevent the light from passing through the side surface of the display modules 30A-30P, the display module 30 may include the light absorbing end member 200 covering the side end 75 of the front cover 70.

The light absorbing end member 200 may be provided to have a black-based color to absorb light.

Alternatively, the light absorbing end member 200 may be formed of a material that absorbs light.

It is appropriate that the light absorbing end member 200 is formed by applying a black-based light-absorbing ink to the side end 75 of the front cover 70 through an ink-jet process and then curing the ink, or formed by coating a light absorption film on the side end 75.

The light absorbing end member 200 may be provided to cover all the side ends 75 of the four sides of the front cover 70 at the side of the four edges E of the substrate 40. Accordingly, the light absorbing end member 200 may be applied or coated to cover all of the side end 75.

In the first display module 30A and the second display module 30E as an example, the light absorbing end members 200A and 200E may be provided on the side ends 75A and 75E of the first front cover 70A and the second front cover 70E in the second direction Y, as illustrated in FIG. 7, and thus the light absorbing end members 200A and 200E may prevent light from passing through the gap G between the first display module 30A and the second display module 30E.

In addition, in the first display module 30A and the third display module 30B as an example, the light absorbing end members 200A and 200B may be provided on the side ends 75A and 75B of the first front cover 70A and the third front cover 70B in the third direction Z, as illustrated in FIG. 9, and thus the light absorbing end members 200A and 200B may prevent light from passing through the gap G between the first display module 30A and the third display module 30B.

That is, the light absorbing end member 200 is arranged on each gap G of the display modules 30A-30P, thereby preventing the light leakage to the side surface of the display modules 30A-30P.

The light absorbing end member 200 may include an upper end 201 arranged at a position corresponding to the upper end 73 of the front cover 70 in the first direction X.

As described above, the light absorbing end member 200 is provided to cover all of the side end 75 from the upper end 73 of the front cover 70 so as to absorb the light flowing out to the side end 75 through the front cover 70.

The light absorbing end member 200 may include a lower end 202 extending downwardly from the upper end 201 and arranged on the side cover 90. The lower end 202 of the light absorbing end member 200 may be provided to be arranged lower than the lower surface 76 of the front cover 70. Accordingly, the light absorbing end member 200 may be provided to cover the entire side end 75 of the front cover 70.

The light absorbing end member 200 may be provided to be arranged at the outermost end of the display modules 30A-30P in the second and third directions Y and Z. In detail, the light absorbing end member 200 may be provided to be arranged on the outside of the ground member 100 in the second and third directions Y and Z.

The light absorbing end member 200 may be formed of a material having less conductivity than a conductivity of the ground member 100. According to embodiments of the disclosure, the light absorbing end member 200 is provided in the form of a film or cured ink and the light absorbing end member 200 has a conductivity less than the conductivity of the ground member 100. Therefore, in response to a current generated by an electrostatic discharge on the light absorbing end member 200, the current may be guided to the metal plate 60 through the ground member 100.

As described above, the light absorbing end member 200 may absorb the light passing through the side end 75 of the front cover 70 to reduce the light leakage generated in the gap G, and to reduce the recognition of the seam that is generated by the light leakage and corresponds to the boundary of the display modules 310A-30P. Accordingly, it is possible to increase the integrity of the display panel 20.

Hereinafter a method of manufacturing the display module 30 according to an embodiment of the disclosure will be briefly described.

Figure 11:
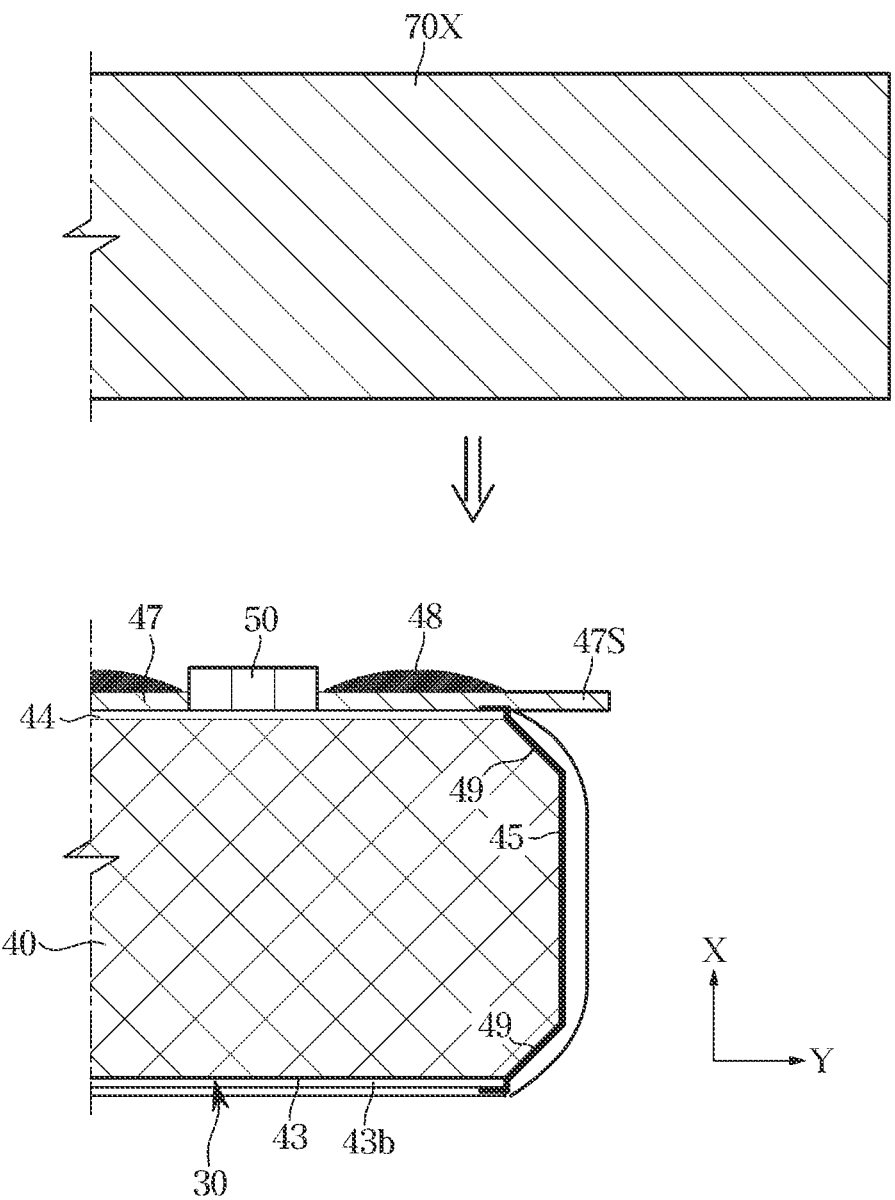
FIG. 11 is a view illustrating a manufacturing process of the display apparatus according to an embodiment of the disclosure.
Figure 12:
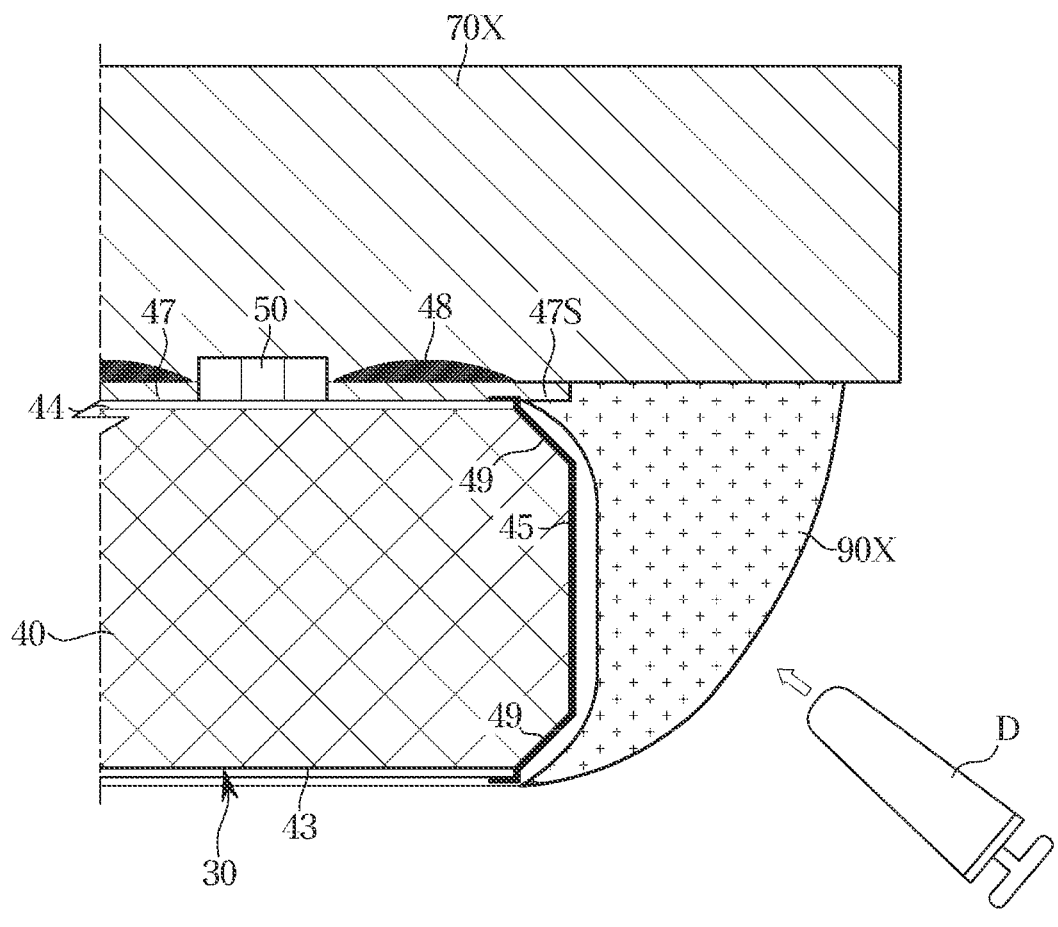
FIG. 12 is a view illustrating a manufacturing process of the display apparatus after the manufacturing process shown in FIG. 11.
Figure 13:
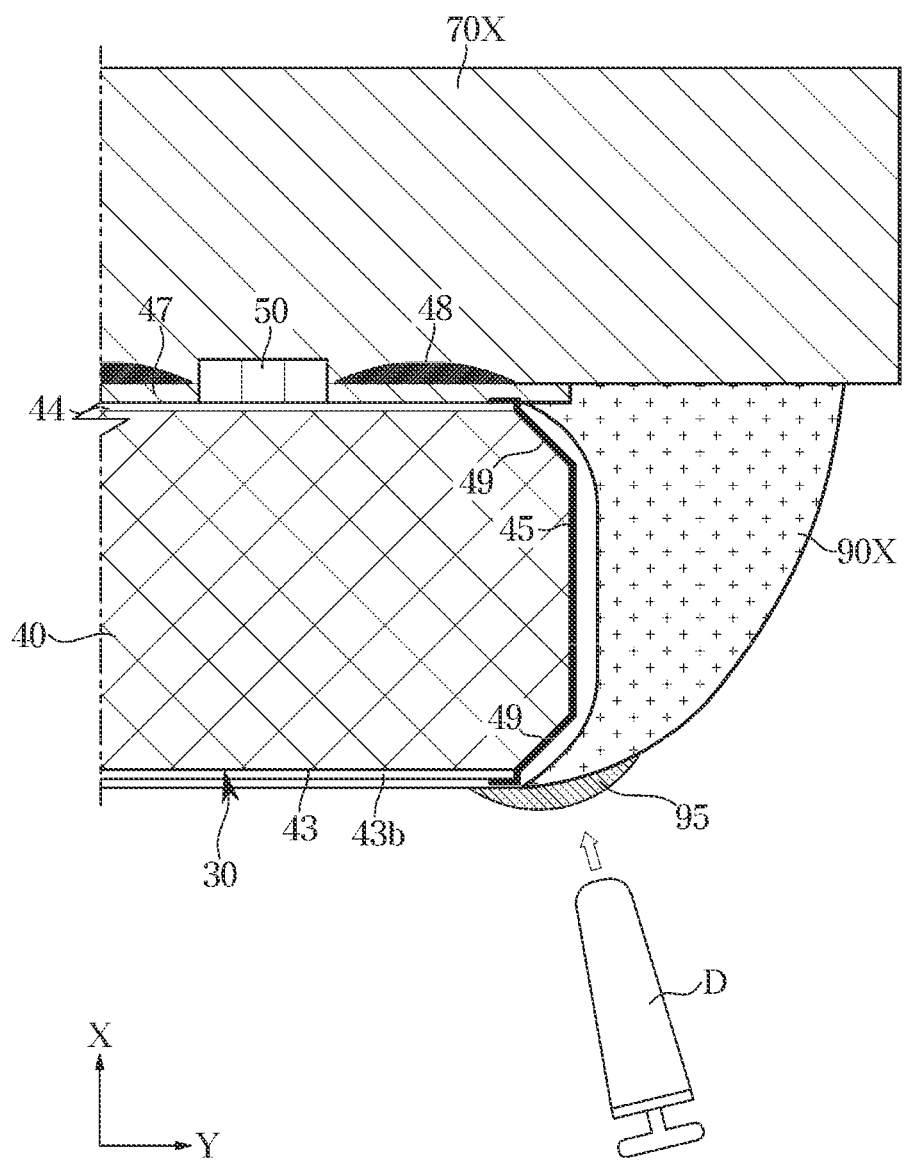
FIG. 13 is a view illustrating a manufacturing process of the display apparatus after the manufacturing process shown in FIG. 12.
Figure 14:
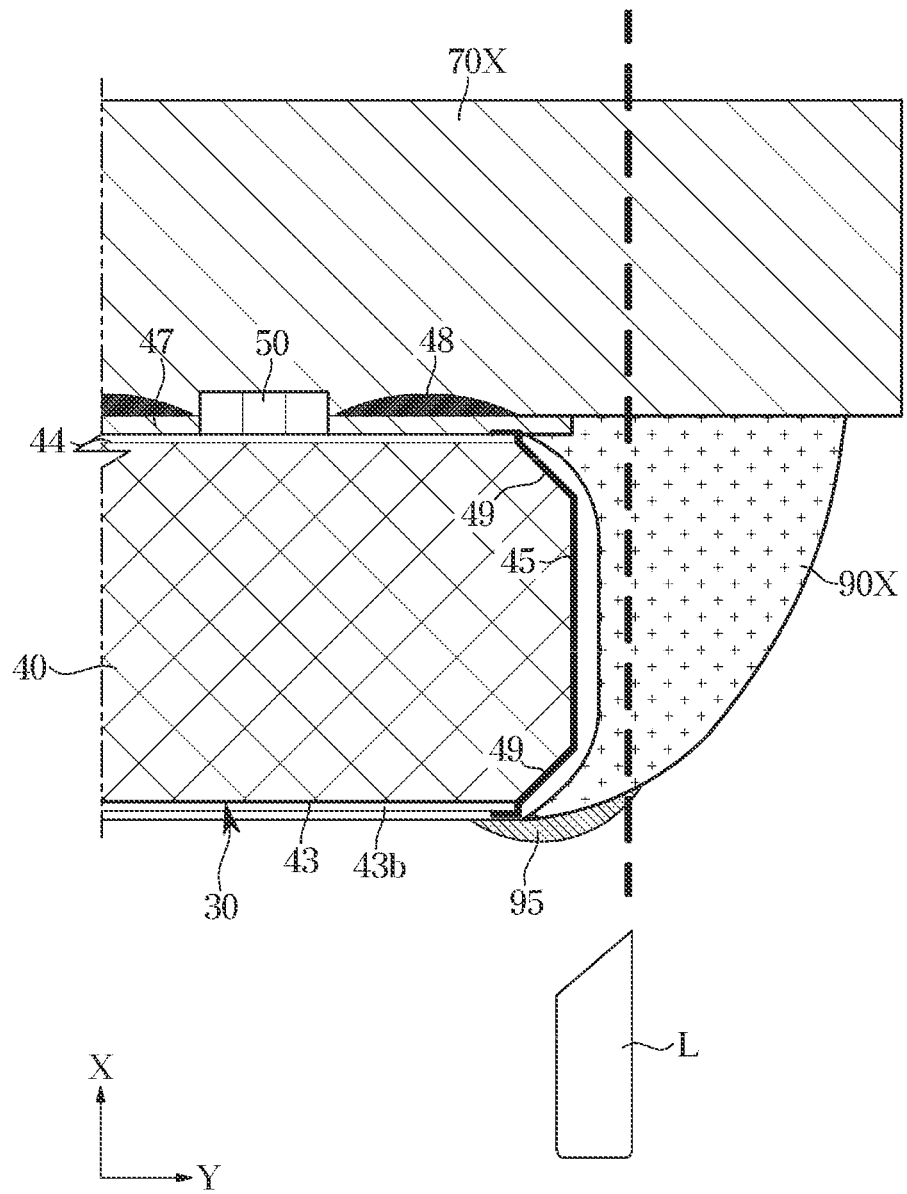
FIG. 14 is a view illustrating a manufacturing process of the display apparatus after the manufacturing process shown in FIG. 13 of the disclosure.
Figure 15:
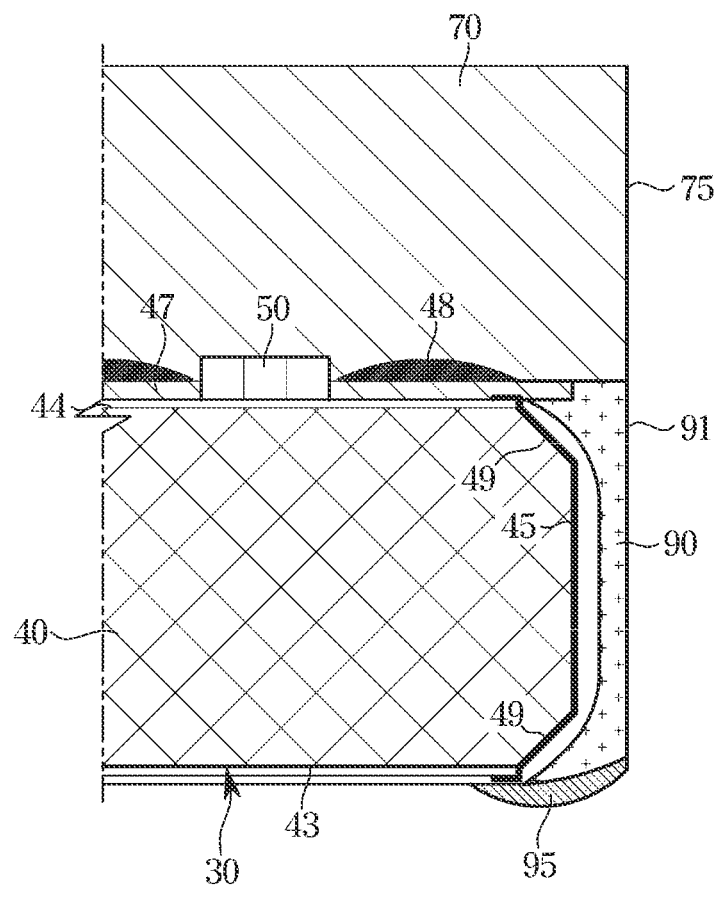
FIG. 15 is a view illustrating a manufacturing process of the display apparatus after the manufacturing process shown in FIG. 14 of the disclosure.
Figure 15:
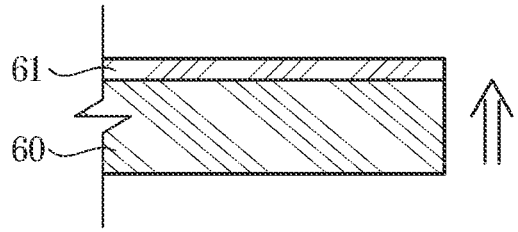
Figure 15:
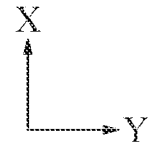
Figure 16:
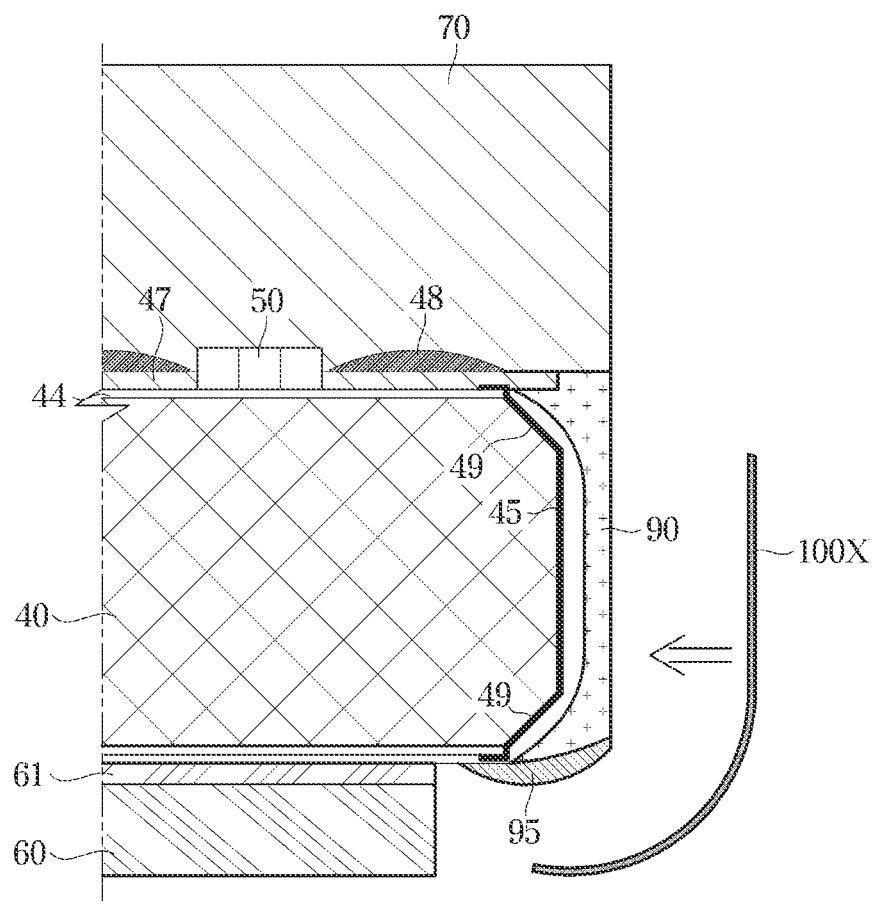
FIG. 16 is a view illustrating a manufacturing process of the display apparatus after the manufacturing process shown in FIG. 15 of the disclosure.
Figure 17:
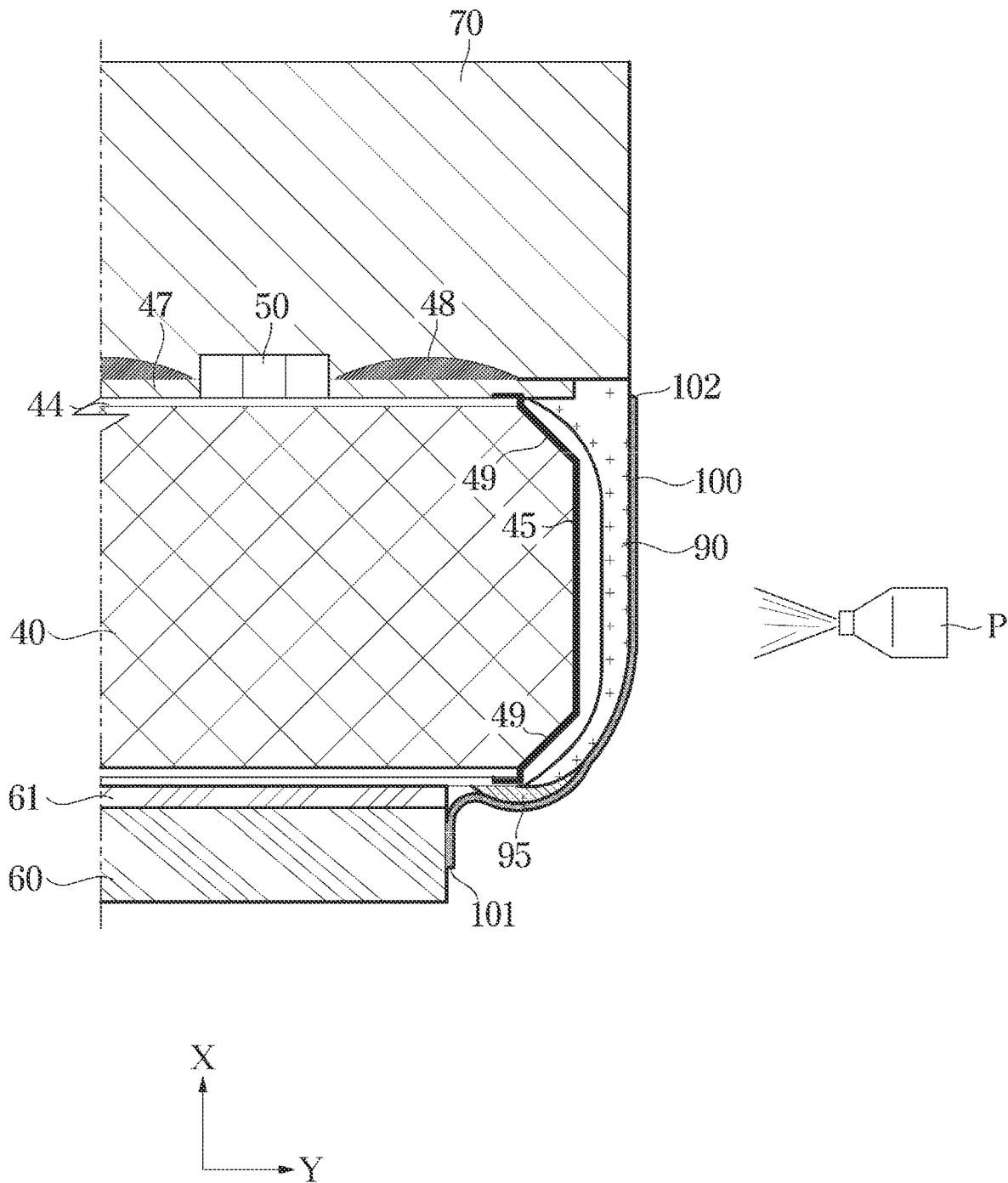
FIG. 17 is a view illustrating a manufacturing process of the display apparatus after the manufacturing process shown in FIG. 16 of the disclosure.
Figure 18:
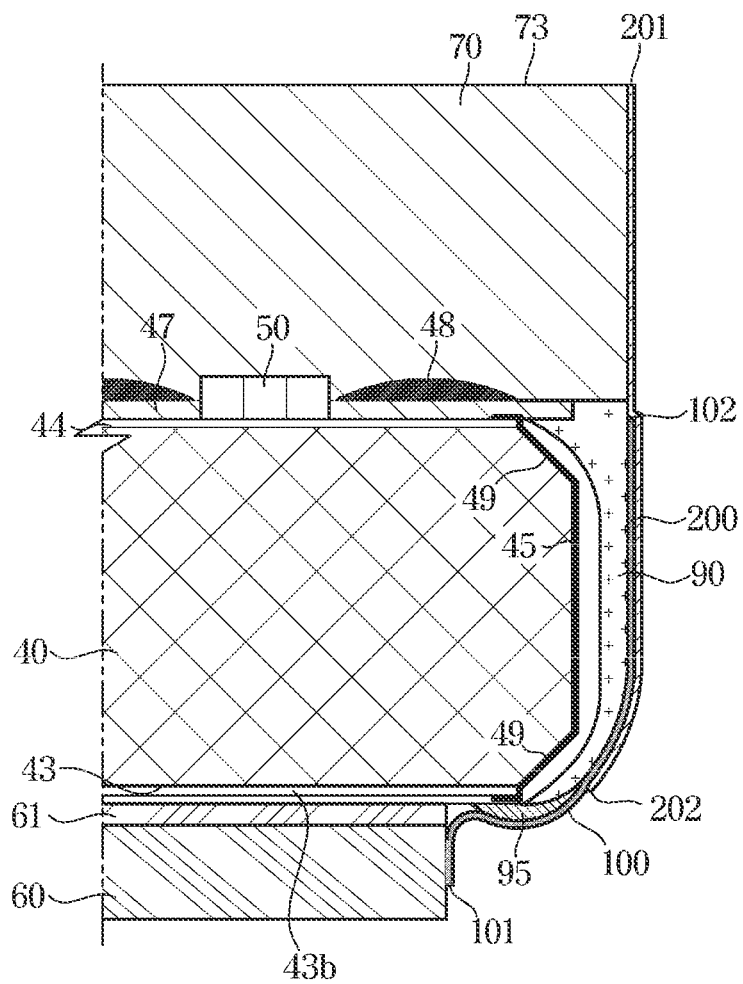
FIG. 18 is a view illustrating a manufacturing process of the display apparatus after the manufacturing process shown in FIG. 17 of the disclosure.

FIG. 11 is a view illustrating a manufacturing process of the display apparatus according to an embodiment of the disclosure, FIG. 12 is a view illustrating a manufacturing process of the display apparatus after the manufacturing process shown in FIG. 11, FIG. 13 is a view illustrating a manufacturing process of the display apparatus after the manufacturing process shown in FIG. 12, FIG. 14 is a view illustrating a manufacturing process of the display apparatus after the manufacturing process shown in FIG. 13 of the disclosure, FIG. 15 is a view illustrating a manufacturing process of the display apparatus after the manufacturing process shown in FIG. 14 of the disclosure, FIG. 16 is a view illustrating a manufacturing process of the display apparatus after the manufacturing process shown in FIG. 15 of the disclosure, FIG. 17 is a view illustrating a manufacturing process of the display apparatus after the manufacturing process shown in FIG. 16 of the disclosure, and FIG. 18 is a view illustrating a manufacturing process of the display apparatus after the manufacturing process shown in FIG. 17 of the disclosure.

As illustrated in FIG. 11, the substrate 40, in which the TFT layer 44 is formed on the mounting surface 41 and the anisotropic conductive layer 47 is bonded to the TFT layer 44, is prepared.

The anisotropic conductive layer 47 may be provided as an anisotropic conductive film. The anisotropic conductive film is cut in the second direction Y with respect to the side surface 45 and cut in the third direction Z with respect to a side end 46S of the side wiring 46. The cutting process may be performed by laser cutting.

This is because, in response to cutting the anisotropic conductive film with respect to the mounting surface 41, the side surface 45, the chamfer 49, or the side wiring 46 of the substrate 40 may be damaged in a comparative embodiment.

It is appropriate that the side end 47S of the anisotropic conductive layer 47 is arranged on the same line as the side surface 45 with respect to the second direction Y and arranged on the same line as the side end 46S of the side wiring 46 with respect to the third direction Z.

However, in consideration of the possibility that the side surface 45 and the side wiring 46 are damaged, the side end 47S of the anisotropic conductive layer 47 may be arranged on the outside of the side surface 45 with respect to the second direction Y and arranged on the outside of the side end 46S of the side wiring 46 with respect to the third direction Z.

The anisotropic conductive layer 47 may be formed in a film shape, and thus an area of the anisotropic conductive layer 47 may be greater than an area of the substrate 40. Accordingly, after the anisotropic conductive layer 47 is bonded to the TFT layer 44, a process of cutting the anisotropic conductive layer 47 may be performed to allow the area of the anisotropic conductive layer 47 to correspond to the area of the substrate 40.

It is appropriate that the anisotropic conductive layer 47 is provided with the area corresponding to the area of the mounting surface 41. However, as described above, because the anisotropic conductive layer 47 is formed of an anisotropic conductive film, it is not easy to allow the area of the anisotropic conductive film to correspond to the area of the mounting surface 41. Further, in response to bonding the anisotropic conductive film corresponding the area of the mounting surface 41 to the mounting surface 41, the anisotropic conductive film may have a smaller cross-section than the mounting surface 41 due to manufacturing tolerances of the anisotropic conductive film. Therefore, the reliability of the display module 30 may be reduced in comparative embodiments.

Accordingly, in embodiments of the disclosure, the anisotropic conductive film having an area greater than the area of the mounting surface 41 may be bonded to the substrate 40, and then the anisotropic conductive film may be cut to an area corresponding to the area of the substrate 40, thereby forming the anisotropic conductive layer 47.

Accordingly, in response to cutting the anisotropic conductive film, the side end 47S of the anisotropic conductive layer 47 may be arranged on an outer region of the mounting surface 41. Particularly, as described above, the anisotropic conductive film is cut based on the side surface 45 or the side end 46S of the side wiring 46, and thus it is appropriate that with respect to the first direction X, the side end 47S of the anisotropic conductive layer 47 is arranged on the same line as the side surface 45 or the side end 46S of the side wiring 46. In addition, the side end 47S of the anisotropic conductive layer 47 may be arranged to be further outward than the side surface 45 or the side end 46S of the side wiring 46 due to burrs formed on the anisotropic conductive film during cutting, or due to a process tolerance.

However, in order to substantially prevent damage to the substrate 40 that may occur in the cutting process, a cutting position of the anisotropic conductive film may be a region outside the side surface 45 or the side end 46S of the side wiring 46.

Accordingly, the side end 47S of the anisotropic conductive layer 47 may be formed outside the substrate 40. Particularly, the side end 47S of the anisotropic conductive layer 47 may be arranged to be further outward than the side cover 90.

In response to the side end 47S of the anisotropic conductive layer 47 being arranged to be further outward than the side cover 90, the side end 47S of the anisotropic conductive layer 47 may be arranged in the gap G between the plurality of display modules 30A-30P. Accordingly, in a comparative embodiment, the side end 47S of the anisotropic conductive layer 47 may be recognized as a seam between the plurality of display modules 30A-30P, and thus the integrity of the screen displayed on the display panel 20 may be reduced in the comparative embodiment.

In addition, in the comparative embodiment, the current generated by the electrostatic discharge is introduced into the display module through the side end 47S of the anisotropic conductive layer 47, thereby causing the damage of the electronic components mounted inside the display module in the comparative embodiment.

That is, in the comparative embodiment, the side end 47S of the anisotropic conductive layer 47 may be exposed to the outside, and in response to the electrostatic discharge around the display module 30, the high voltage electricity may be introduced into the inside of the display module 30 through the side end 47S of the anisotropic conductive layer 47, thereby causing the damage of the display module 30.

In the display apparatus 1 according to an embodiment of the disclosure, in order to prevent the damage of the display module 30, the side end 47S of the anisotropic conductive layer 47 may be arranged inwards of the side end 75 of the front cover 70. Particularly, the side end 47S of the anisotropic conductive layer 47 may be arranged on the first region 71.

Accordingly, a region, which extends to a region outside the mounting surface 41 of the substrate 40, in the anisotropic conductive layer 47 may be provided to extend to the first region 71.

As described above, the display module 30 includes the side cover 90 arranged on the outside of the substrate 40, and even when the side end 47S of the anisotropic conductive layer 47 is arranged on the outside of the substrate 40, the side end 47S of the anisotropic conductive layer 47 may be covered by the side cover 90.

Because the side end 47S of the anisotropic conductive layer 47 is provided not to be exposed to the outside by the side cover 90, it is possible to prevent the recognition of the seam caused by the side end 47S of the anisotropic conductive layer 47, and to prevent the current from entering the side end 47S of the anisotropic conductive layer 47.

That is, even when the side end 47S of the anisotropic conductive layer 47 is arranged in the region outside the substrate 40, the side end 47S of the anisotropic conductive layer 47 may be covered by the side cover 90 and thus it is possible to prevent the above-mentioned difficulties. However, in response to the side end 47S of the anisotropic conductive layer 47 extending to the outside of the side cover 90, the side end 47S of the anisotropic conductive layer 47 may be exposed to the outside of the display module 30. Therefore, the side end 47S of the anisotropic conductive layer 47 may be arranged more inwards than the side end 91 of the side cover 90.

As described above, the side end 91 of the side cover 90 may be provided on the same line as the side end 75 of the front cover 70, and thus the side end 47S of the anisotropic conductive layer 47 may be arranged more inwards than the side end 75 of the front cover 70.

However, embodiments of the disclosure are not limited thereto, and the anisotropic conductive layer 47 may be provided to have an area corresponding to the area of the mounting surface 41 and be arranged on the same line as the edge 41S of the mounting surface 41.

That is, unlike the above-mentioned description, the anisotropic conductive layer 47 may be formed of a film having an area corresponding to the area of the mounting surface 41, and the anisotropic conductive layer 47 may be arranged to overlap with the mounting surface 41 in the first direction X without the cutting process of the anisotropic conductive layer 47. The side end 47S of the anisotropic conductive layer 47 may be arranged more inwards than the side surface 45. The display module 30, in which the plurality of inorganic light emitting devices 50 and the electronic components forming the display module 30 are mounted on the anisotropic conductive layer 47, is prepared and a front cover 70X is bonded to the mounting surface 41 of the display module 30.

The front cover 70X means the front cover 70X before being cut. The front cover 70X may be provided to cover the entire area of the mounting surface 41. The front cover 70X may be formed through a compression curing process on the mounting surface 41.

As illustrated in FIG. 12, a side cover 90X is dispensed to a space between the chamfer 49 formed between the rear surface of the front cover 70X and the side surface 45 of the substrate 40 in the first direction X.

The side cover 90X means the side cover 90 before being cut together with the front cover 70X.

A predetermined dose of the side cover 90X may be applied by the dispenser D. The side cover 90X that is applied may be cured through subsequent operations. For example, the side cover 90X may be formed of non-conductive black resin.

The side cover 90X may be applied to cover all the rear surface of the front cover 70X and the side surface 45 of the substrate 40, the chamfer 49 formed between the side surface 45 of the substrate 40 and the mounting surface 41, and the chamfer 49 formed between the side surface 45 and the rear surface 43.

In addition, in the anisotropic conductive layer 47, the region
   arranged outside the mounting surface 41 may also be
     covered by the applied side cover 90X.

The dispensing operation of the side cover 90X may be performed on all four edges E of the substrate 40. Accordingly, the side cover 90X may be dispensed to cover all of a plurality of the side surface 45 of the substrate 40. In addition, in the anisotropic conductive layer 47, the entire region
   arranged outside the mounting surface 41 may be covered
     by the side cover 90X.

While the side cover 90X is cured, with respect to the first direction X, the side cover 90X may be bonded to the rear surface of the front cover 70X and the side surface 45 of the substrate 40, the chamfer 49 formed between the mounting surface 41 and the side surface 45, and the region X, which is arranged outside the mounting surface 41, in the anisotropic conductive layer 47.

Based on the side cover 90X including a photosensitive material, the side cover 90X may be colored in a dark color by emitting ultraviolet rays (UX) or the like as a subsequent operation. However, based on the side cover 90X being formed of a translucent or opaque material without including a photosensitive material, such a manufacturing process is not required.

Next, as illustrated in FIG. 13, the sealing member 95 is dispensed in a portion in which the side wiring 46 is connected to the rear wiring layer 43b. In detail, the sealing member 95 may be provided to be applied to the edge of the rear surface 43 of the substrate 40.

Because the sealing member 95 is provided to seal the edge portion of the rear surface 43 of the substrate 40, the portion in which the side wiring 46 is connected to the rear wiring layer 43b, on the rear surface 43 of the substrate 40 may be dispensed so as not to be exposed to the outside.

As illustrated in FIG. 14, the front cover 70X and the side cover 90X may be cut in the first direction X to allow at least a portion of the front cover 70X to be extended outward with respect to the second and third directions Y and Z perpendicular to the first direction X in which the mounting surface 41 faces. The sealing member 95 may be also cut simultaneously, as needed.

The cutting process may be performed by laser L cutting or the like. Accordingly, the front cover 70X and the side cover 90X may be simultaneously cut.

In the cutting process, the front cover 70X and the side cover 90X may be cut to allow the front cover 70X to include the first region 71 (refer to FIGS. 7 and 9) in the third direction Z, which is perpendicular to the first direction X and the second direction Y, as well as the second direction Y and to allow the side cover 90X to be arranged in the second direction Y and the third direction Z.

That is, the cutting process may be performed on all four edges E of the substrate 40.

The cutting process may be performed to allow a cutting position of the front cover 70X and the side cover 90X to be further outward than the side end 47S of the anisotropic conductive layer 47.

This is because due to the cutting position of the front cover 70X and the side cover 90X being more inward than the side end 47S of the anisotropic conductive layer 47, the anisotropic conductive layer 47 may be exposed to the outside of the side cover 90.

As illustrated in FIG. 15, the side end 75 of the front cover 70 and the side end 91 of the side cover 90 may be formed on the same line in the first direction X by the cutting process. It is appropriate that the side end 75 of the front cover 70 and the side end 91 of the side cover 90 may be cut to be formed in a direction parallel to the first direction X.

The process may be performed to allow a length of the first region 71 (refer to FIGS. 7 and 9), which extends to the outside of the mounting surface 41, to be approximately less than or equal to half of a length of the gap G formed between the plurality of display modules 30A-30P in the state in which the display module 30 is provided as the plurality of display modules 30A-30P.

The metal plate 60 is bonded to the rear surface 43 of the substrate 40.

The rear adhesive tape 61 may be arranged on the upper surface of the metal plate 60 in the first direction X, and thus in response to compressing the rear adhesive tape 61 and the rear surface 43 of the substrate 40, the rear adhesive tape 61 may bond the substrate 40 to the metal plate 60.

However, embodiments of the disclosure are not limited thereto, and the rear adhesive tape 61 may be arranged on the rear surface 43 of the substrate 40, and the metal plate 60 may be compressed against the rear adhesive tape 61 arranged on the rear surface 43.

In the third direction Z, the metal plate 60 may be provided to be arranged more inwards than the rear surface 43 of the substrate 40 in the third direction Z by the sealing member 95. However, in the second direction Y, the metal plate 60 may be arranged at a position corresponding to the edge of the rear surface 43 of the substrate 40 in the second direction Y.

In this case, a portion of the side cover 90X dispensed on the rear surface 43 of the substrate 40 remains, but this is a relatively small portion that may be negligible. Therefore, the metal plate 60 and the rear surface 43 of the substrate 40 may be bonded to each other approximately horizontally.

As illustrated in FIG. 16, a ground member 100X may be arranged on the side end of the side cover 90. The ground member 100X may be bonded to the side cover 90 such that the first member 101 is bonded to the metal plate 60 and the second member 102 is arranged on the side cover 90 (refer to FIG. 17).

After the first member 101 of the ground member 100 is bonded to the metal plate 60 and the second member 102 is arranged on the side cover 90 as shown in FIG. 17, the light absorbing end member 200 may be formed by printing ink that absorbs light on the side end 75 of the front cover 70 and the side surface 45 through inkjet printing P as shown in FIG. 18.

However, embodiments of the disclosure are not limited thereto, and the light absorbing end member 200 may be formed by bonding a film formed of a light absorbing material on the side end 75 of the front cover 70 and the side surface 45.

The light absorbing end member 200 may be formed through the curing.

According to embodiments, the display module 30, which is processed through the above-mentioned processing, may be prepared in plurality corresponding to the plurality of display modules 30A-30P, and the plurality of display modules 30A-30P may be arranged adjacent to each other. In this case, the plurality of display modules 30A-30P may be fixed through a jig. The plurality of display modules 30A-30P may be arranged in an M*N matrix.

As is apparent from the above description, a display apparatus may have a seamless effect in which a seam is not visually recognized, by absorbing light incident on a gap between a plurality of display modules arranged adjacent to each other.

Further, in order to prevent a light leakage generated between a plurality of display modules, a display apparatus may include a light absorbing end member arranged on a side surface of a front cover so as to prevent light from passing through a side surface of the display modules. Accordingly, the display apparatus may have a seamless effect between the plurality of display modules.

Although certain embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A display module comprising:
a substrate comprising a mounting surface, on which a plurality of inorganic light emitting devices is mounted, and a side surface, wherein the mounting surface faces in a first direction and extends in a second direction;
a front cover covering the mounting surface and comprising a side end in a region outwards from the mounting surface in the second direction;
a side cover covering and sealing the side surface of the substrate and bonded to a lower surface of the front cover, corresponding to the region outwards from the mounting surface, and the side surface of the substrate; and
a light absorbing end member covering the side end of the front cover and configured to prevent light, emitted from the plurality of inorganic light emitting devices, from passing through the side end of the front cover, wherein the light absorbing end member covers at least a portion of a side end of the side cover to seal the front cover and the side cover.

2. The display module of claim 1, wherein the light absorbing end member extends from an upper end of the side end of the front cover in a direction opposite to the first direction.

3. The display module of claim 2, wherein the light absorbing end member extends from the upper end of the side end of the front cover in the direction opposite to the first direction to cover at least a portion of the side cover.

4. The display module of claim 1, further comprising:
a metal plate provided on a rear surface of the substrate, the rear surface being a side of the substrate opposite to the mounting surface; and
a ground member covering at least a portion of the side end of the side cover and in contact with the metal plate to be grounded with the metal plate.

5. The display module of claim 4, wherein the light absorbing end member extends from an upper end of the side end of the front cover in a direction opposite to the first direction to cover at least a portion of the side end of the side cover, and
wherein the ground member is between the side end of the side cover and the light absorbing end member.

6. The display module of claim 1, wherein the light absorbing end member comprises a light-absorbing material.

7. The display module of claim 6, wherein the side cover comprises a light-absorbing material.

8. The display module of claim 1, wherein the light absorbing end member has a black color.

9. The display module of claim 8, wherein the side cover has the black color.

10. The display module of claim 4, wherein the ground member comprises a metal material.

11. The display module of claim 10, wherein the ground member has a higher conductivity than a conductivity of the side cover.

12. The display module of claim 1, wherein the side end of the front cover and a side end of the side cover are arranged on a same line that extends in the first direction, and
wherein each of the side end of the front cover and the side end of the side cover face in the second direction.

13. A display apparatus comprising:
a display module array comprising a plurality of display modules horizontally arranged in an M*N matrix,
wherein the plurality of display modules comprises:
a first display module comprising:
a first substrate comprising a first mounting surface, on which a plurality of first inorganic light emitting devices is mounted, and a first side surface facing in a second direction, the first mounting surface facing in a first direction and extending in the second direction;
a first front cover covering the first mounting surface and comprising a first side end in a first region outwards from the first mounting surface in the second direction;
a first side cover covering and sealing the first side surface of the first substrate and bonded to a lower surface of the first front cover, corresponding to the first region outside the first mounting surface, and the first side surface of the first substrate; and
a first light absorbing end member covering the first side end of the first front cover and configured to prevent light, emitted from the plurality of first inorganic light emitting devices, from passing through the first side end of the first front cover, wherein the first light absorbing end member covers at least a portion of a side end of the first side cover to seal the first front cover and the first side cover; and
a second display module adjacent to the first display module in the second direction, the second display module comprising:
a second substrate comprising a second mounting surface, on which a plurality of second inorganic light emitting devices is mounted, and a second side surface facing in a third direction opposite to the second direction, the second mounting surface facing in the first direction and extending in the second direction;
a second front cover covering the second mounting surface and comprising a second side end in a second region outwards from the second mounting surface in the third direction;
a second side cover covering and sealing the second side surface of the second substrate and bonded to a lower surface of the second front cover, corresponding to the second region outside the second mounting surface, and the second side surface of the second substrate; and
a second light absorbing end member covering the second side end of the second front cover and configured to prevent light, emitted from the plurality of second inorganic light emitting devices, from passing through the second side end of the second front cover, wherein the second light absorbing end member covers at least a portion of a side end of the second side cover to seal the second front cover and the second side cover.

14. The display apparatus of claim 13, wherein the first light absorbing end member extends from an upper end of the first side end of the first front cover in a direction opposite to the first direction.

15. The display apparatus of claim 14, wherein the first light absorbing end member extends from the upper end of the first side end of the first front cover in the direction opposite to the first direction such as to cover at least a portion of the first side cover.

16. A method of manufacturing a display apparatus, the method comprising:
covering a mounting surface, on which a plurality of inorganic light emitting devices is mounted, of a substrate with a front cover, wherein the mounting surface faces in a first direction and extends in a second direction, and the front cover includes a side end that is in a region outwards from the mounting surface in the second direction; providing a side cover such that the side cover covers and seals a side surface of the substrate, and is bonded to a lower surface of the front cover, corresponding to the region outwards from the mounting surface in the second direction, and the side surface of the substrate; and covering the side end of the front cover with a light absorbing end member configured to prevent light, emitted from the plurality of inorganic light emitting devices, from passing through the side end of the front cover, wherein the light absorbing end member covers at least a portion of a side end of the side cover to seal the front cover and the side cover.

17. The method of claim 16, wherein the light absorbing end member extends from an upper end of the side end of the front cover in a direction opposite to the first direction.

18. The method of claim 17, wherein the light absorbing end member extends from the upper end of the side end of the front cover in the direction opposite to the first direction such as to cover at least a portion of the side cover.

19. The method of claim 16, further comprising:
providing a metal plate on a rear surface of the substrate, the rear surface being a side of the substrate opposite to the mounting surface; and
providing a ground member such that the ground member covers at least a portion of the side end of the side cover and is in contact with the metal plate so as to be grounded with the metal plate.

20. The method of claim 19, wherein the light absorbing end member extends from an upper end of the side end of the front cover in a direction opposite to the first direction such as to cover at least a portion of the side end of the side cover, and wherein the ground member is between the side end of the side cover and the light absorbing end member.

* * * * *